(12) United States Patent
Vasilache et al.

(10) Patent No.: US 10,665,247 B2
(45) Date of Patent: May 26, 2020

(54) VECTOR QUANTIZATION

(71) Applicant: Nokia Technologies Oy, Espoo (FI)

(72) Inventors: Adriana Vasilache, Tampere (FI); Anssi Sakari Ramo, Tampere (FI); Lasse Juhani Laaksonen, Tampere (FI)

(73) Assignee: NOKIA TECHNOLOGIES OY, Espoo (FI)

( * ) Notice: Subject to any disclaimer, the term of this patent is extended or adjusted under 35 U.S.C. 154(b) by 0 days.

(21) Appl. No.: 15/424,698

(22) Filed: Feb. 3, 2017

(65) Prior Publication Data

US 2017/0148455 A1 May 25, 2017

Related U.S. Application Data

(63) Continuation of application No. 14/413,412, filed as application No. PCT/IB2012/053561 on Jul. 12, 2012.

(51) Int. Cl.

| | | |
|---|---|---|
| *G10L 19/00* | (2013.01) | |
| *G10L 19/038* | (2013.01) | |
| *G10L 19/07* | (2013.01) | |
| *H03M 7/30* | (2006.01) | |
| *H04N 19/94* | (2014.01) | |
| *H04N 19/194* | (2014.01) | |
| *H04N 19/124* | (2014.01) | |
| *G10L 19/22* | (2013.01) | |
| *G10L 19/012* | (2013.01) | |
| *G10L 25/93* | (2013.01) | |

(52) U.S. Cl.
CPC ............ *G10L 19/038* (2013.01); *G10L 19/07* (2013.01); *G10L 19/22* (2013.01); *H03M 7/3082* (2013.01); *H04N 19/124* (2014.11); *H04N 19/194* (2014.11); *H04N 19/94* (2014.11); *G10L 19/012* (2013.01); *G10L 25/93* (2013.01); *G10L 2019/0001* (2013.01); *G10L 2019/0005* (2013.01)

(58) Field of Classification Search
None
See application file for complete search history.

(56) References Cited

U.S. PATENT DOCUMENTS

| | | |
|---|---|---|
| 4,922,508 A | 5/1990 | Moriya |
| 5,987,407 A | 11/1999 | Wu et al. |

(Continued)

FOREIGN PATENT DOCUMENTS

| | | |
|---|---|---|
| CN | 1608284 A | 4/2005 |
| CN | 1659785 A | 8/2005 |

(Continued)

OTHER PUBLICATIONS

International Search Report and Written Opinion received for corresponding Patent Cooperation Treaty Application No. PCT/IB2012/053561, dated Apr. 25, 2013, 17 pages.

(Continued)

*Primary Examiner* — Richard Z Zhu
(74) *Attorney, Agent, or Firm* — Alston & Bird LLP

(57) ABSTRACT

It is inter alia disclosed to determine a first quantized representation of an input vector, and to determine a second quantized representation of the input vector based on a codebook depending on the first quantized representation.

12 Claims, 5 Drawing Sheets

(56) References Cited

U.S. PATENT DOCUMENTS

| | | | |
|---|---|---|---|
| 6,253,173 B1 | 6/2001 | Ma | |
| 6,311,153 B1 | 10/2001 | Nakatoh et al. | |
| 6,871,106 B1* | 3/2005 | Ishikawa | G10L 19/0212 700/94 |
| 6,952,671 B1 | 10/2005 | Kolesnik et al. | |
| 7,003,454 B2* | 2/2006 | Ramo | G10L 19/07 704/223 |
| 7,243,061 B2* | 7/2007 | Norimatsu | G06Q 20/10 704/205 |
| 7,392,179 B2* | 6/2008 | Yasunaga | G10L 19/07 704/219 |
| 8,438,020 B2* | 5/2013 | Satoh | G10L 19/032 704/221 |
| 8,521,522 B2 | 8/2013 | Matsumura et al. | |
| 8,527,265 B2* | 9/2013 | Reznik | G10L 19/24 704/200 |
| 2002/0010577 A1 | 1/2002 | Matsumoto et al. | |
| 2005/0285764 A1 | 12/2005 | Bessette et al. | |
| 2007/0067166 A1 | 3/2007 | Pan et al. | |
| 2009/0198491 A1* | 8/2009 | Sato | G10L 19/07 704/219 |
| 2009/0299738 A1* | 12/2009 | Sato | G10L 19/07 704/222 |
| 2010/0174547 A1 | 7/2010 | Vos | |
| 2011/0004469 A1* | 1/2011 | Sato | G10L 19/07 704/219 |
| 2011/0040558 A1 | 2/2011 | Ehara | |
| 2011/0282677 A1 | 11/2011 | Wu et al. | |
| 2011/0316732 A1 | 12/2011 | Satoh et al. | |
| 2012/0046955 A1 | 2/2012 | Rajendran et al. | |
| 2013/0282269 A1 | 10/2013 | Hannukainen et al. | |

FOREIGN PATENT DOCUMENTS

| | | |
|---|---|---|
| CN | 101030376 A | 9/2007 |
| CN | 101165777 A | 4/2008 |
| CN | 102081926 A | 6/2011 |
| EP | 0658873 A1 | 6/1995 |
| EP | 1467350 A1 | 10/2004 |
| JP | S63-37400 A | 2/1988 |
| JP | H09-106299 A | 4/1997 |
| JP | H10-276095 A | 10/1998 |
| JP | 2009-182855 A | 8/2009 |
| JP | 2012-128022 A | 7/2012 |
| KR | 2005-0008761 A | 1/2005 |
| KR | 2012-0064264 A | 6/2012 |
| WO | WO 00/16485 A1 | 3/2000 |
| WO | 2003/056564 A1 | 7/2003 |
| WO | 2003/103151 A1 | 12/2003 |
| WO | 2007/058465 A1 | 5/2007 |
| WO | 2007/114290 A1 | 10/2007 |
| WO | 2008/047795 A1 | 4/2008 |
| WO | 2009/093714 A1 | 7/2009 |
| WO | 2012/016122 A2 | 2/2012 |
| WO | 2013/005065 A1 | 1/2013 |

OTHER PUBLICATIONS

Sung et al., "An Efficient LSF Quantization Using Dynamic Bit Allocation", IEEE International Conference on Acoustics, Speech and Signal Processing, Apr. 19-24, 2009, pp. 4141-4144.

Pan et al., "An Efficient Encoding Algorithm for Vector Quantization Based on Subvector Technique", IEEE Transactions on Image Processing, vol. 12, No. 3, Mar. 2003, pp. 265-270.

Vasilache et al., "Multiple-Scale Leader-Lattice VQ With Application to LSF Quantization", Signal Processing, vol. 82, No. 4, Apr. 2002, pp. 563-586.

Office action received for corresponding Korean Patent Application No. 2015-7003638, dated Nov. 13, 2015, 5 pages of office action and no pages of office action translation available.

Extended European Search Report received for corresponding European Patent Application No. 12881027.2, dated Mar. 14, 2016, 7 pages.

Office action received for corresponding Japanese Patent Application No. 2015-521076, dated Mar. 18, 2016, 6 pages of office action and 5 pages of office action translation available.

Office action received for corresponding Chinese Patent Application No. 201280075741.5, dated Sep. 26, 2016, 12 pages of office action and no pages of office action translation available.

Final Office action received for corresponding Korean Patent Application No. 2015-7003638, dated Oct. 10, 2016, 4 pages of office action and no pages of office action translation available.

Non-Final Office action received for corresponding U.S. Appl. No. 14/413,412, dated Jan. 3, 2017, 23 pages.

Office action received for corresponding Korean Patent Application No. 2017-7005357, dated Mar. 17, 2017, 5 pages of office action and no pages of office action translation available.

Final Office action received for corresponding U.S. Appl. No. 14/413,412, dated Jul. 13, 2017, 25 pages.

Non-Final Office action received for corresponding U.S. Appl. No. 14/413,412, dated Feb. 20, 2018, 12 pages.

Office action received for corresponding Japanese Patent Application No. 2017-026682, dated Apr. 9, 2018, 3 pages of office action and 4 pages of translation available.

Advisory Action for U.S. Appl. No. 14/413,412 dated Oct. 26, 2017.

Office Action for U.S. Appl. No. 14/413,412 dated Jul. 23, 2018.

Extended European Search Report received for corresponding European Patent Application No. 17152782.3, dated Jun. 8, 2017, 7 pages.

Office action received for corresponding Chinese Patent Application No. 201280075741.5, dated May 26, 2017, 9 pages of office action and no pages of translation available.

Adriana Vasilache and Ioan Tabus, "LSF Quantization with multiple scale lattice VQ for transmission over noisy channels", in Proceedings EUSIPCO 2002, Toulouse, France, Sep. 3-6, 2002.

Office Action for U.S. Appl. No. 14/413,412 dated Jan. 3, 2019.

Office Action for European Application No. 12 881 027.2 dated Nov. 16, 2018, 6 pages.

* cited by examiner

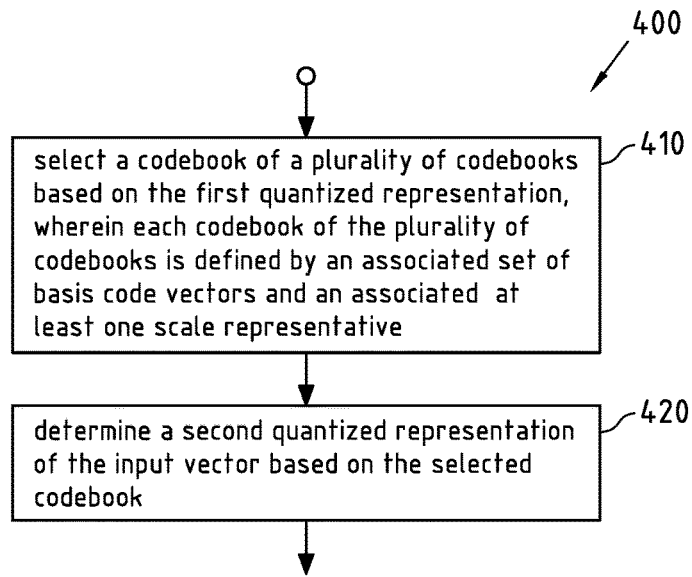
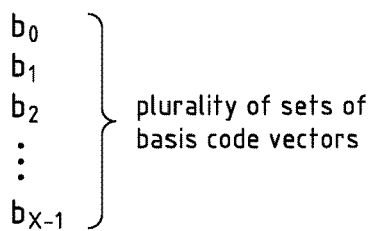
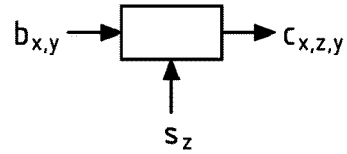
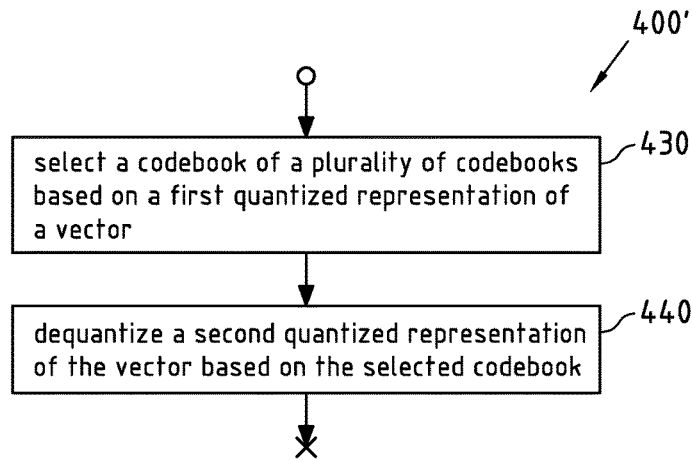

VECTOR QUANTIZATION

FIELD

Embodiments of this invention relate to coding, in particular to speech and audio coding.

BACKGROUND

Low complexity algorithms for speech and audio coding constitute a very relevant asset, for instance for mobile terminal based communications.

Due to low storage and low complexity, while preserving coding efficiency, structured codebooks may be preferred in several state of the art speech and audio codecs, like for instance the Enhanced Voice Service (EVS) codec to be standardized within the Third Generation Partnership Project (3GPP).

Codebooks used within these speech and audio codecs may for instance be based on lattice structures, as described in reference "Multiple-scale leader-lattice VQ with application to LSF quantization" by A. Vasilache, B. Dumitrescu and I. Tabus, Signal Processing, 2002, vol. 82, pages 563-586, Elsevier, which is incorporated herein in its entirety by reference.

It is possible to define a lattice codebook as a union of leader classes, each of which is characterized by a leader vector. A leader vector is an n-dimensional vector (with n denoting an integer number), whose (e.g. positive) components are ordered (e.g. decreasingly). The leader class corresponding to the leader vector then consists of the leader vector and all vectors obtained through all the signed permutations of the leader vector (with some possible restrictions). It is also possible that one, some or all leader classes are respectively associated with one or more scales, and the lattice codebook is then formed as a union of scaled and/or unscaled leader classes.

An input vector may for instance be encoded (for instance in quantization) by finding the nearest neighbour codevectorcodevector in the codebook, i.e. the codevectorcodevector that has the smallest distance with respect to the input vector. An identifier of this codevectorcodevector (e.g. an index assigned to this codevectorcodevector) then may serve as an encoded representation of the input vector.

For instance, the speech or audio coding may be applied to different coding modes. As an example, quantization may be applied to a voiced, an unvoiced, a generic, a transition or a comfort noise generation (CNG) part of a signal. The CNG part uses fewer parts in general, and, consequently, fewer bits for quantization. However, for lower bitrates, the lattice based codebooks are not very efficient.

SUMMARY OF SOME EMBODIMENTS OF THE INVENTION

Although the use of structured codebooks already reduces the amount of memory and the computational complexity required for encoding an input vector, further reduction of the memory requirements and/or the computational complexity and/or enhanced quantization quality is desirable, for instance with respect to different coding modes, in particular for audio signals comprising voiced, unvoiced, generic, transition or CNG parts.

According to a first exemplary embodiment of first aspect of the invention, a method is disclosed, said method comprising determining a first quantized representation of an input vector, and determining a second quantized representation of the input vector based on a codebook depending on the first quantized representation.

According to a second exemplary embodiment of the first aspect of the invention, an apparatus is disclosed, which is configured to perform the method according to the first aspect of the invention, or which comprises means for determining a first quantized representation of an input vector, and means for determining a second quantized representation of the input vector based on a codebook depending on the first quantized representation.

According to a third exemplary embodiment of the first aspect of the invention, an apparatus is disclosed, comprising at least one processor and at least one memory including computer program code, the at least one memory and the computer program code configured to, with the at least one processor, cause the apparatus at least to perform the method according to the first aspect of the invention. The computer program code included in the memory may for instance at least partially represent software and/or firmware for the processor. Non-limiting examples of the memory are a Random-Access Memory (RAM) or a Read-Only Memory (ROM) that is accessible by the processor.

According to a fourth exemplary embodiment of the first aspect of the invention, a computer program is disclosed, comprising program code for performing the method according to the first aspect of the invention when the computer program is executed on a processor. The computer program may for instance be distributable via a network, such as for instance the Internet. The computer program may for instance be storable or encodable in a computer-readable medium. The computer program may for instance at least partially represent software and/or firmware of the processor.

According to a fifth exemplary embodiment of the first aspect of the invention, a computer-readable medium is disclosed, having a computer program according to the first aspect of the invention stored thereon. The computer-readable medium may for instance be embodied as an electric, magnetic, electro-magnetic, optic or other storage medium, and may either be a removable medium or a medium that is fixedly installed in an apparatus or device. Non-limiting examples of such a computer-readable medium are a RAM or ROM. The computer-readable medium may for instance be a tangible medium, for instance a tangible storage medium. A computer-readable medium is understood to be readable by a computer, such as for instance a processor.

In the following, features and embodiments pertaining to all of these above-described aspects of the invention will be briefly summarized.

As a non-limiting example, the input vector may represent a vector comprising Line Spectral Frequencies (LSF) of an input signal, wherein this input signal may represent at least a part audio signal, e.g. a part of a voice signal or a part of a non-voice signal, wherein this audio signal may comprise voiced and/or unvoiced and/or generic and/or transition and/or CNG parts. For instance, the input signal to be quantized may represent residual data of an audio signal to be encoded.

As an example, the first quantized representation may be determined by means of a first quantization stage being performed based on a plurality of codevectors. This plurality of codevectors of the first quantization stage may represent a first stage codebook.

For instance, the first quantized representation may represent the codevector selected from the plurality of codevectors for quantizing the input vector. As another example, the first quantized representation may represent an identifier of the selected codevector, wherein this identifier may represent a codevector index. Thus, for instance, if the first quantized representation may comprise n bits, the first stage codebook may comprise a maximum of $2^n$ codevectors.

Then, a second quantized representation of the input vector is determined based on a codebook depending on the first quantized representation.

For instance, it may be assumed that this second quantized representation is performed by means of a second quantization stage. This second quantization stage may perform a quantization based on a plurality of codebooks, wherein each of this plurality of codebooks comprises at least one codevector.

The codebook used for the quantization of the input vector in the second stage depends on the first quantized representation. Thus, as an example, the codebook used in the second stage may be selected from the plurality of codebooks of the second stage based on the first quantized representation of the input vector.

For instance, there may be defined a mapping between a codevector of the plurality of codevectors of the first stage and a codebook of the plurality of codebooks of the second stage. Accordingly, such a mapping may be defined for each codevector of the plurality of codevectors of the first stage and a respective codebook of the plurality of codebooks of the second stage. Thus, based on the first quantized representation of the input vector, wherein this first quantized representation may represent the codevector selected in the first stage or may represent in indicator of the codevector selected in the first stage, the codebook for performing quantization in the second stage may be selected from the plurality of codebooks of the second stage.

For instance, the codebooks of the second stage may represent lattice codebooks.

As an example, the first quantized representation of the input vector may represent a codevector index being indicative of the codevector selected in the first stage. Then, for instance, a codebook of the plurality of codebooks is selected which is associated with the codevector index of the first quantized representation. For instance, each codevector index of first stage may be associated with a corresponding codebook of the plurality of codebooks of the second stage.

Then, based on the selected codebook, a codevector of the selected codebook may be determined, e.g. based on a distortion metric. For instance, the codevector of the selected codebook may be determined for quantizing the input vector having the lowest distortion with respect to the input vector, wherein the distortion is determined based on the distortion metric. As an example, the distortion metric may represent a distance between the codevector and the input vector. For instance, a Hamming distance or an Euclidean distance or any other distance may be used.

Thus, a codevectorcodevector of the plurality of codevectorcodevectors may be determined based on the applied distortion metric, wherein this determining may for instance comprise calculating the distortion for at least one codevector of the plurality of codevectors, wherein the codevector of the at least one codevector is selected for quantization which has the lowest distortion in accordance with the determined distortion metric. For instance, said at least one codevector may represent all codevectors of the plurality of codevectors of the selected codebook or a subset of codevectors of the plurality of codevectors of the selected codebook.

According to an exemplary embodiment of the first of the invention, said determining a second quantized representation of the input vector comprises selecting a codebook of a plurality of codebooks based on the first quantized representation.

This may show the advantage that specific codebooks may be defined for the second stage, wherein each specific codebook is adapted to the quantization performed in the first stage. Thus, at least one codebook of the plurality of codebooks of the second stage may represent a specific codebook tuned for the particular residual data associated with this codebook to be encoded which may improve the coding efficiency.

According to an exemplary embodiment of the first of the invention, prior to determining the second quantized representation of the input vector, the input vector is normalized based on the first quantized representation.

For instance, said normalizing may comprise multiplying the vector components of the input vector with normalization coefficients in order to obtain a normalized representation of the input vector, where the normalization coefficients depend on the first quantized representation of the input vector.

The normalization is performed based on the first quantized representation.

For instance, there may be defined a plurality of sets of normalization coefficients, each set of normalization coefficients comprising at least one normalization coefficient to be used for normalizing the input vector, wherein one set of normalization coefficients is selected from the plurality of sets of normalization coefficients based on the first quantized representation of the input vector.

For instance, there may be defined a mapping between a codevector of the plurality of codevectors of the first stage and a set of normalization coefficients of the plurality of sets of normalization coefficients. Accordingly, such a mapping may be defined for each codevector of the plurality of codevectors of the first stage and a respective set of normalization coefficients of the plurality of normalization coefficients. Thus, based on the first quantized representation of the input vector, wherein this first quantized representation may represent the codevector selected in the first stage or may represent an indicator of the codevector selected in the first stage, the set of normalization coefficients for performing normalization of the input vector may be selected from the plurality of sets of normalization coefficients.

As an example, if the input vector comprises n vector coefficients, a set of normalization coefficients may comprise n normalization coefficients. Then, normalization of the input vector may be performed by multiplying a vector component of the plurality of vector components of the input vector with an associated normalization coefficient of the selected set of normalization coefficients. This may be performed for each vector component of the input vector, wherein a respective vector component is multiplied with the respective normalization coefficients of the set of normalization coefficients in order to obtain a normalized representation of the input vector.

As an example, the first quantized representation of the input vector may represent a codevector index being indicative of the codevector selected in the first stage. Then, in step 310, a set of normalization coefficients of the plurality of sets of normalization coefficients is selected which is associated with the codevector index of the first quantized representation. For instance, each codevector index of first stage may be associated with a corresponding set of normalization coefficients of the plurality of sets of normalization coefficients.

According to an exemplary embodiment of the first of the invention, said input vector comprises a plurality of vector components, and wherein said normalizing comprises multiplying at least one vector component of the input vector with a respective normalize coefficient depending on the first quantized representation.

According to an exemplary embodiment of the first of the invention, a set of normalization coefficients of a plurality of sets of normalization coefficients is selected based on the first quantized representation, wherein the respective normalization coefficient to be multiplied with one of the at least one vector component of the input vector is from the selected set of normalization coefficients.

According to an exemplary embodiment of the first of the invention, a codebook is defined by an associated set of basis codevectors and an associated at least one scale representative, wherein a codevector of the codebook is defined by a basis codevector of the associated set of basis codevectors scaled by a scale representative of the associated at least one scale representative.

Each codebook of the plurality of codebooks is defined by an associated set of basis codevectors and an associated at least one scale representative.

Each set of basis codevectors comprises at least one basis codevector. Since each set of basis codevectors is associated with at least one scale representative of a plurality of scale representatives, a codevector can be determined based on a basis codevector of a set of potential basis codevectors and a scale representative of the at least one scale representative associated with the set of potential basis codevectors, i.e. the codevector may be represented based on a basis codevector scaled by the respective scale representative. For instance, the scale representative may represent a scale value, wherein a codevector may be determined based on a multiplication of a basis codevector and the respective scale value.

For instance, at least one set of basis codevectors is associated with at least two scale representatives. Furthermore, as an example, just one scale representative may be associated with just one set of basis codevectors.

Accordingly, as an example, a codebook may comprise a set of codevectors comprising codevectors based on the plurality of sets of basis codevectors and based on the respective at least one scale value associated with a respective set of basis codevectors of the plurality of basis codevectors. This set of codevectors may comprise, for each basis codevector of each set of basis codevectors and for each of the at least one scale representative associated with a respective set of basis codevectors, a codevector based on the respective basis codevector scaled by the respective scale representative.

For instance, said sets of basis codevectors may represent leader classes, wherein each leader class comprises a different leader vector and permutations of said leader vector. Thus, said leader vector and the permutations of said leader vector may represent the basis codevectors of the respective set of basis codevectors.

The plurality of sets of basis codevectors may represent a subset of a second plurality of sets of basis codevectors. For instance, under the assumption that each set of basis codevectors represents a leader class, the plurality of leader classes may represent a subset of a second plurality of leader classes. Thus, the plurality of leader classes may be considered as a truncated plurality of leaders classes with respect to the second plurality of leader classes.

For instance, there may be provided a plurality of set of basis codevectors, wherein each $b_x$, with $x \in \{0, 1, \ldots X-1\}$, represents a set of basis codevector of the plurality of sets of basis codevectors, wherein X represent the number of sets of the plurality of sets of basis codevectors. Each set of basis codevectors is associated or comprises at least one basis codevector $b_{x,y}$, wherein $B_x$ represents the number of basis codevectors of a respective set of basis codevectors $b_x$, i.e. $y \in \{0, 1, \ldots B_x-1\}$ holds. For instance, the number $B_x$ of basis codevectors of a set of basis codevectors may be different for different sets of basis codevectors and/or it may be the same for at least two sets of basis codevectors.

As an example, a codevector $c_{x,z,y}$ may be determined based on a basis codevector $b_{x,y}$ and based on a scale representative $s_z$, wherein index z represents the index of the respective scale representative of the plurality of scale representatives $s_0 \ldots s_{s-1}$, i.e. $z \in \{0, 1, \ldots S-1\}$ holds.

For instance, in case the values $b_{x,y,t}$ of the basis codevectors $b_{x,y}=[b_{x,y,0}, b_{x,y,i}, \ldots, b_{x,y,n-1}]$ represent absolute values, wherein $t \in \{0, 1, \ldots n-1\}$ holds and n represents the length of the respective basis codevector $b_{x,y}$, and if the absolute valued input vector is used for determining the potential codevector of a respective set of basis codevectors, the sign of each value $b_{x,y,t}$ at the (t+1)th position of the determined nearest basis codevector $b_{x,y}$ may be assigned based on the sign of the respective value $i_t$ at the (t+1)th position of the input vector i, before determining a codevector $c_{x,z,y}$ based on basis codevector $b_{x,y}$ and based on a scale representative $s_z$ is performed, as exemplarily depicted in FIG. 2c. As an example, if $i=[i_0, i_1, \ldots, i_{n-1}]$ represents the input vector, the absolute valued input vector may be represented by $[|i_0|, |i_1|, \ldots |i_{n-1}|]$.

For instance, the sign of each value $b_{x,y,t}$ at the (t+1)th position of the determined nearest basis codevector $b_{x,y}$ may be assigned to the sign of the respective value $i_t$ at the (t+1)th position of the input vector, respectively, wherein this may hold if the parity of the basis codevectors $b_{x,y}$ of the set of basis codevectors $b_x$ is 0. As another example, if the parity of the basis codevectors $b_{x,y}$ of the set of basis codevectors $b_x$ is −1, the signs of the values $b_{x,y,t}$ of the potential basis codevector may be assigned corresponding to the signs of the values of the input vector at the same position in the vector, respectively, and if there are not an odd number of negative components, the value $b_{x,y,t}$ in the potential basis codevector having the lowest non-null absolute value may change its sign. Or, as another example, if the parity of the basis codevectors $b_{x,y}$ of the set of basis codevectors $b_x$ is +1, the signs of the values $b_{x,y,t}$ of the potential basis codevector may be assigned corresponding to the signs of the values of the input vector at the same position in the vector, respectively, and if there are not an even number of negative components, the value $b_{x,y,t}$ in the potential basis codevector having the lowest non-null absolute value may change its sign As a non-limiting example, a codevector $c_{x,z,y}$ may be determined based on a basis codevector by $b_x$ and based on a scale representative $s_z$ by $c_{x,z,y}=[b_{x,y,0} \cdot s_z, b_{x,y,1} \cdot s_z, \ldots, b_{x,y,n-1} \cdot s_z]$.

Each of the scale representatives $s_z$, wherein $z \in \{0, 1, \ldots S-1\}$ holds, is associated with at least one set of basis codevectors. For instance, as a non-limiting example this respective at least one set of basis codevectors may be represented by the set of basis codevectors $b_x$, with $x \in \{0, 1, \ldots n_z-1\}$, wherein $n_z$ may represent the number of sets of basis codevectors associated with the respective scale representative $s_z$, wherein $0 < n_z < X$ holds. Based on this linkage between a respective scale representative $s_z$ and the associated at least one set of basis codevectors $b_x$, with $x \in \{0, 1, \ldots n_z-1\}$, the associated at least one set of codevectors $c_{x,z,y}$, with $x \in \{0, 1, \ldots n_z-1\}$ and $y \in \{0, 1, \ldots B_x-1\}$ and $z \in \{0, 1, \ldots S-1\}$, can be determined.

Thus, as an example, a codebook structure of the above mentioned codebook may be defined by the plurality of scale representatives $s_z$, the plurality of sets of basis codevectors $b_x$, and the linkage between each scale representative with the associated at least one set of basis codevectors.

Since at least one set of basis codevectors, e.g. at least the set of basis codevectors $b_0$, is associated with at least two scale representatives, the same set of basis codevectors can be used to construct codevectors of the at least one set of codevectors associated with a first scale representative and to construct codevectors of the at least one set of codevectors associated with at least one further scale representative.

According to an exemplary embodiment of the first of the invention, said input vector at least partially represents at least one of a video, image, audio and speech signal.

Thus, said leader vector and the permutations of said leader vector may represent the basis codevectors of the respective set of basis codevectors.

According to a first exemplary embodiment of second aspect of the invention, a method is disclosed, said method comprising selecting a codebook of a plurality of codebooks based on a first quantized representation of an vector, and dequantizing a second quantized representation of the vector based on the selected codebook.

According to a second exemplary embodiment of the second aspect of the invention, an apparatus is disclosed, which is configured to perform the method according to the second aspect of the invention, or which comprises means for selecting a codebook of a plurality of codebooks based on a first quantized representation of an vector, and means for dequantizing a second quantized representation of the vector based on the selected codebook.

According to a third exemplary embodiment of the second aspect of the invention, an apparatus is disclosed, comprising at least one processor and at least one memory including computer program code, the at least one memory and the computer program code configured to, with the at least one processor, cause the apparatus at least to perform the method according to the second aspect of the invention. The computer program code included in the memory may for instance at least partially represent software and/or firmware for the processor. Non-limiting examples of the memory are a Random-Access Memory (RAM) or a Read-Only Memory (ROM) that is accessible by the processor.

According to a fourth exemplary embodiment of the second aspect of the invention, a computer program is disclosed, comprising program code for performing the method according to the second aspect of the invention when the computer program is executed on a processor. The computer program may for instance be distributable via a network, such as for instance the Internet. The computer program may for instance be storable or encodable in a computer-readable medium. The computer program may for instance at least partially represent software and/or firmware of the processor.

According to a fifth exemplary embodiment of the second aspect of the invention, a computer-readable medium is disclosed, having a computer program according to the second aspect of the invention stored thereon. The computer-readable medium may for instance be embodied as an electric, magnetic, electro-magnetic, optic or other storage medium, and may either be a removable medium or a medium that is fixedly installed in an apparatus or device. Non-limiting examples of such a computer-readable medium are a RAM or ROM. The computer-readable medium may for instance be a tangible medium, for instance a tangible storage medium. A computer-readable medium is understood to be readable by a computer, such as for instance a processor.

For instance, this method according to the second aspect of the invention may be used for dequantizing the input vector quantized by any of the embodiments of the first aspect of the invention.

A codebook of a plurality of codebooks is selected based on a first quantized representation of a vector. This first quantized representation may represent any of the first quantized representations of the input vector described with respect to the first aspect of the invention. This selection of a codebook may be performed as described with respect to the first aspect of the invention.

For instance, the plurality of codebooks represent the plurality of codebooks used in the first aspect of the invention, wherein the first quantized representation indicates the codebook which is used for the second stage quantization in the first aspect of the invention.

Then, a second quantized representation of the vector is dequantized based on the selected codebook. This second quantized representation may represent any of the second quantized representations of the input vector described with respect to the first aspect of the invention.

Thus, a reverse quantization of the second stage quantization of the first aspect of the invention can be performed in accordance with the selected codebook. Accordingly, all explanations given with respect to the second stage quantization in the first aspect of the invention also hold for the dequantization of the second aspect of the invention.

The dequantized second quantized representation of the vector may then correspond to the input vector of the first aspect of the invention.

According to an exemplary embodiment of the second aspect of the invention, a normalization representation based on the first quantized representation of the vector is determined (or selected) and a normalization of the vector based on the normalization representation is reversed.

If a normalization of the input vector has been performed in the first aspect of the invention, the second aspect may comprise reversing this normalization by selected a normalization representation based on the first quantized representation.

For instance, said input vector may comprise a plurality of vector components, and said reverse normalization may comprise dividing at least one vector component of the dequantized input vector with a respective normalization coefficient depending on the first quantized representation.

As an example, a set of normalization coefficients may be selected from a plurality of sets of normalization coefficients based on the first quantized representations, as described with respect to the first aspect of the invention, and wherein the respective normalization coefficient to be divided with respect to one of the at least one vector component of the dequantized input vector is from the selected set of normalization coefficients.

For instance, any explanations presented with respect to the first aspect of the invention may also hold for the second aspect of the invention.

According to a first exemplary embodiment of third aspect of the invention, a method is disclosed, said method comprising grouping a plurality of vector components of an input vector into at least two groups of vector components in accordance with a rule based on the vector components, wherein each group of the at least two groups of vector components comprises at least one vector component of the plurality of vector components, and determining, for at least one of the at least two groups of vector components, a quantized representation of the respective group of vector components based on a codebook associated with the group of vector components.

According to a second exemplary embodiment of the third aspect of the invention, an apparatus is disclosed, which is configured to perform the method according to the third aspect of the invention, or which comprises means for grouping a plurality of vector components of an input vector into at least two groups of vector components in accordance with a rule based on the vector components, wherein each group of the at least two groups of vector components comprises at least one vector component of the plurality of vector components, and means for determining, for at least one of the at least two groups of vector components, a quantized representation of the respective group of vector components based on a codebook associated with the group of vector components.

According to a third exemplary embodiment of the third aspect of the invention, an apparatus is disclosed, comprising at least one processor and at least one memory including computer program code, the at least one memory and the computer program code configured to, with the at least one processor, cause the apparatus at least to perform the method according to the third aspect of the invention. The computer program code included in the memory may for instance at least partially represent software and/or firmware for the processor. Non-limiting examples of the memory are a Random-Access Memory (RAM) or a Read-Only Memory (ROM) that is accessible by the processor.

According to a fourth exemplary embodiment of the third aspect of the invention, a computer program is disclosed, comprising program code for performing the method according to the third aspect of the invention when the computer program is executed on a processor. The computer program may for instance be distributable via a network, such as for instance the Internet. The computer program may for instance be storable or encodable in a computer-readable medium. The computer program may for instance at least partially represent software and/or firmware of the processor.

According to a fifth exemplary embodiment of the third aspect of the invention, a computer-readable medium is disclosed, having a computer program according to the third aspect of the invention stored thereon. The computer-readable medium may for instance be embodied as an electric, magnetic, electro-magnetic, optic or other storage medium, and may either be a removable medium or a medium that is fixedly installed in an apparatus or device. Non-limiting examples of such a computer-readable medium are a RAM or ROM. The computer-readable medium may for instance be a tangible medium, for instance a tangible storage medium. A computer-readable medium is understood to be readable by a computer, such as for instance a processor.

The input vector comprises a plurality of vector components.

As a non-limiting example, the input vector may represent a vector comprising Line Spectral Frequencies (LSF) of an input signal, wherein this input signal may represent at least a part audio signal, e.g. a part of a voice signal or a part of a non-voice signal, wherein this audio signal may comprise voiced and/or unvoiced and/or generic and/or transition and/or CNG parts. For instance, the input signal to be quantized may represent residual data of an audio signal to be encoded, e.g. a residual of a Line Spectral Frequency (LSF) vector.

As an example, the input vector may be defined as vector $i=[i_0, i_1, \ldots, i_k]$ comprising k vector components $i_x$ with $x \in \{0, 1, \ldots k-1\}$. It has to be understood that other representations may be used as well.

Then, said plurality of vector components of the input vector are grouped into at least two groups of vector components in accordance with a rule based one the vector components.

As an example, it may be defined that each group of the at least two groups of vector components comprises a predefined number of vector components. For instance, each vector component of the plurality of vector components may be associated with a respective group of the at least two groups of vector components, i.e., the vector components of the at least two groups of vector components represent the plurality of vector components, or, as another example, the vector components of the at least two groups of vector components may represent a subset of vector components of the plurality of vector components.

As an example, said rule may represent a rule based on energy values associated with the vector components. For instance, said rule may specify that the vector components of each of the at least two groups of vector components must fulfill a predefined energy characteristic. As an example, this rule may define that vector components of a group of the at least two groups of vector components may have similar energy values, and/or, for instance, said rule may specify that a first group of the at least two groups of vector components, this first group comprising $l_1 < k$ vector components, comprises the $l_1$ most or less energetic vector components of the plurality of vector components, whereas the remaining $k-l_1$ vector components of the plurality of vector components are associated with the remaining at least one group of the at least two groups of vector components not representing the first group of vector components.

As an example, the energy value associated with a respective vector component may for instance represent the energy value of the respective vector component, or a value being proportional to the energy value of the respective vector component, or an energy value representing the energy value of the respective vector component weighted with a weighting factor associated with this vector component, or a value being proportional to the energy value representing the energy value of the respective vector component weighted with a weighting factor associated with this vector component, or the energy rank of the respective vector component with respect to the energy ranks of the remaining vector components of the plurality of vector components. For instance, the vector component being associated with the lowest energy value of the plurality of vector components may be associated with the lowest energy rank, e.g. rank=1 or rank=k, and the vector component being associated with the highest energy value of the plurality of vector component may be associated with the highest energy rank, e.g. rank=k or rank=1. Thus, the energy rank of a vector component may indicate the position of the respective vector component with regard to its energy compared to energy of all other remaining vector components of the plurality of vector components.

The energy value ex of a vector component $i_x$ with $x \in \{0, 1, \ldots k-1\}$ may for instance be calculated based on $$e_x = i_x^2$$

or based on any other well-suited definition of an energy value.

If a vector component $i_x$ with $x \in \{0, 1, \ldots k-1\}$ is weighted with a corresponding weighting factor $w_x$, then the energy value weighted with the corresponding weighting factor might for instance be calculated based on $$e_x = w_x i_x^2.$$

For instance, the grouping said plurality of vector components into at least two groups of vector components may comprise an initialisation by an initial defining said at least two groups of vector components, wherein each of group of said at least two groups of vector components comprises at least one vector component of the plurality of vector components in accordance with an initial mapping of vector components of the plurality of vector components of the input vector to the at least two groups of vector components, and wherein vector components of different groups of the at least two groups of vector components are swapped between the different groups so long until the rule based on energy values associated with the vector components is fulfilled, i.e., until the vector components of each group of the at least two groups of vector components fulfill this rule. For instance, said initial mapping may be performed in a same way for a plurality of input vectors and thus the initial mapping may be the same for a plurality of input vectors. As an example, an initial mapping scheme may be determined based on the average energy of vector components in a training set and afterwards this initial mapping scheme is used for the above mentioned initial mapping of vector components of the plurality of vector components of the input vector to the at least two groups of vector components for a plurality of input vectors.

Or, as another example, said initial mapping of vector components of the plurality of vector components of the input vector to the at least two groups of vector components may be performed in a way that the vector components are mapped to the at least two groups of vector components in accordance with the rule based on energy values associated with the vector components. Thus, the mapping algorithm may consider the rule when mapping the vector components of the plurality of vector components to the at least two groups of vector components.

After the grouping has been performed, the vector components of each group of the at least two groups of vector components fulfill the rule based on energy values associated with the vector components of the plurality of vector components.

Then, for each group of at least one group of the at least two groups of vector components a quantized representation of the respective group of vector components is determined based on a codebook associated with the respective group of vector components. Accordingly, at least one quantized representation of at least one group of vector components is determined, wherein each of the at least one quantized representation of the at least one group of vector components is associated with a corresponding group of vector components of the at least one group of vector components. For instance, each group of the at least two groups vector components may be quantized.

For instance, the same codebook may be used for quantizing each of the at least one group of vector components.

Or, as another example, a codebook used for quantizing a group of vector components of the at least one group of vector components to be quantized may be chosen from a plurality of codebooks depending on the codevectors of the respective group of vector components. Thus, for instance, a group of vector components comprising vector components being associated with lower/low energy values may be quantized based on a codebook optimized for low energy vector components, whereas a group of vector components comprising vector component being associated with higher/high energy values (e.g. higher energy values as the group of vector components comprising vector components being associated with lower/low energy values) may be quantized based on a codebook optimized for high energy vector components. Accordingly, for instance, a well-suited codebook for quantizing a respective group of at least one group of vector components to be quantized may be selected. Thus, as an example, due to fulfillment of the rule based on energy values associated with the vector components of the at least two groups of vector components the specific energy characteristic of a respective group of vector components may be used for selected a respective codebook of the plurality of codebooks, wherein codebooks of the plurality of codebooks may be optimized for different energy characteristics of vector components.

For instance, each of the at least one group of the at least two groups to be encoded may be encoded by applying the two-stage quantization in accordance with the first aspect of the invention.

The at least one quantized representation of the at least one group of codevectors of the at least two groups of codevectors obtained may be considered as a second quantized representation of the input vector in accordance with the first aspect of the invention.

According to an exemplary embodiment of the third aspect of the invention, said rule is one of a rule based on energy values associated with the vector components and a rule based on a predefined norm associated with the vector components.

For instance, if the rule represents the rule based on a predefined norm associated with the vector components this rule may define that vector components of a group of the at least two groups of vector components may fulfill a specific norm or are in predefined range based on the specific norm, wherein this norm for instance may represent a respective Lp-norm of a corresponding Lp-space, wherein p≥1 holds or any other well-suited norm.

For instance, the rule may define that a specific norm applied to the vector components of a first group of the at least two groups of vector components is within first predefined range, and that the specific norm applied to the vector components of a second group of the at least two groups of vector coefficients is within a second predefined range, and so on, wherein the first and second predefined range differ from each other.

As an example, the at least two groups of vector components represent n groups of vector components $g_x$ with $x \in \{1, 2, \ldots n\}$ with $n \geq 2$, wherein an xth group $g_x$ of the at least two groups of vector components comprises $l_x$ vector coefficients of the plurality of vector coefficients of the input vector, and wherein said rule specifies that the specific norm of the $l_x$ vector coefficients of an xth group $g_x$ is within a predefined range $r_x$ associated with this xth group $g_x$. Thus, a plurality of x ranges $l_x$ may be defined, wherein each range $r_x$ associated with a respective xth group $g_x$ may represent a different range.

For instance, if the specific norm represents the lp norm, and the $l_x$ vector coefficients of an xth group $g_x$ may be denoted as $g_{x,0}, g_{x,1}, \ldots, g_{x,l_x-1}$, this norm may be calculated for the $l_x$ vector coefficients of an xth group $g_x$ as follows:

$$\left( \sum_{y=0}^{l_x-1} (g_{x,y})^p \right)^{\frac{1}{p}}$$

For instance, an l1 norm (i.e., p=1) may be used, or an l2 norm (i.e., p=2) may be used, or any other well-suited norm.

According to an exemplary embodiment of the third aspect of the invention, said rule specifies that the vector components of each of the at least two groups of vector components must fulfill a predefined energy characteristic.

As an example, this rule may define that vector components of a group of the at least two groups of vector components may have similar energy values, and/or, for instance, said rule may specify that a first group of the at least two groups of vector components, this first group comprising $l_1 < k$ vector components, comprises the $l_1$ most or less energetic vector components of the plurality of vector components, whereas the remaining $k-l_1$ vector components of the plurality of vector components are associated with the remaining at least one group of the at least two groups of vector components not representing the first group of vector components.

Thus, any well-suited predefined energy characteristic which depends on the energy values of the vector components may be used. For instance, in accordance with his rule, the coefficients of each group of the at least two groups of energy values fulfill the specific energy characteristic, wherein each group of the at least two groups of vector components may be associated with a respective energy characteristic of a plurality of (e.g. different) energy characteristics.

For instance, the order of the vector coefficients within a respective group of the at least two groups may be irrelevant for the applied rule.

According to an exemplary embodiment of the third aspect of the invention, said rule specifies that an energy value associated with a respective vector component of each vector component of a first group of the at least two groups of vector components is higher than an energy value associated with a respective vector component of each vector component of each group of the remaining groups of the at least two groups of vector components.

For instance, it may be assumed that the said rule may specify that a first group of the at least two groups of vector components comprises the $l_1$ most energetic vector components (or the $l_1$ less energetic vector components) of the plurality of vector components, whereas the remaining $k-l_1$ vector components of the plurality of vector components are associated with the remaining at least one group of the at least two groups of vector components not representing the first group of vector components. Furthermore, as an example, in accordance with this rule, a second group of the at least two groups of vector components may comprise the $l_2$ most energetic vector components (or the $l_2$ less energetic vector components) of the remaining $k-l_1$ vector components of the plurality of vector components.

According to an exemplary embodiment of the third aspect of the invention, the at least two groups of vector components represent n groups of vector components $g_x$ with $x \in \{1, 2, \ldots n\}$ with $n \geq 2$, wherein an xth group $g_x$ of the at least two groups of vector components comprises $l_x$ vector coefficients of the plurality of vector coefficients of the input vector, and wherein said rule specifies that the $l_x$ vector coefficients of an xth group $g_x$ represent the $$\left(\left(\sum_{y=1}^{x-1} l_y\right)+1\right)th \text{ to } \left(\left(\sum_{y=1}^{x-1} l_y\right)+l_x\right)$$

most energetic (or less energetic) vector coefficients of the plurality of vector coefficients.

According to an exemplary embodiment of the third aspect of the invention, said grouping said plurality of vector components of the input vector into at least two groups of vector components comprises: splitting the input vector into said at least two groups of vector components, and swapping a vector component of a first group of the at least two groups of vector components for a vector component of a second group of the at least two groups of vector components until each group of the at least two groups of vector coefficients fulfills the rule.

For instance, it may be assumed without any limitations that the input vector represents a vector comprising k vector components, wherein this vector is split into to groups $g_1$ and $g_2$ of vector components:

$$i = \left( \underbrace{i_0 \; \cdots \; i_{l1-2} \; i_{l1-1}}_{g_1} \; \underbrace{i_{l1} \; i_{l1+1} \; \cdots \; i_{l1+l2-1}}_{g_2} \right)$$

Then it may be checked whether each group of the at least two groups of vector components fulfills the rule.

If each of the at least two groups fulfills the rule then there is no need for rearranging vector coefficients between two different groups of the at least two groups of vector coefficients and the at least two groups obtained by splitting can be used for determining said quantized representation of at least one group of the at least two groups of vector components.

For instance, it may be determined that at least one group of the at least one group does not fulfill the rule it may be proceeded with swapping a vector component of a first group of the at least two groups for a vector component of a second group of the at least two groups of vector components.

For instance, this swapping may be performed in a way such that the first group and the respective vector coefficient of the first group to be swapped and that the corresponding second group and the respective vector coefficient of the second group to be swapped are chosen based on the rule, such that after the swapping the rule is fulfilled, or, if more than one couple of coefficients has to be swapped in order to fulfill the rule, that the selected vector coefficient of the selected first group and the selected vector coefficient of the selected second group represent one couple of coefficients of the more than one couple of coefficients to be swapped in order to fulfill the rule.

As an example, it may be necessary to swap $i_{l1-1}$ of the first group of vector coefficients $g_1$ for $i_{l1}$ of the second group of vector coefficients, wherein this swapping may result in rearranged groups of vector coefficients as follows:

$$i' = \left( \underbrace{i_0 \; \cdots \; i_{l1-2} \; i_{l1}}_{g_1} \; \underbrace{i_{l1-1} \; i_{l1+1} \; \cdots \; i_{l1+l2-1}}_{g_2} \right)$$

Thus, as an example, each group of said at least two groups of vector coefficients may be associated with fixed positions of vector i of the input vector, wherein said swapping may be performed by exchanging the positions of the vector coefficients to be swapped in vector i, wherein vector i' may represent the vector of the input vector after the swapping.

Then, it may be checked whether each group of the at least two groups of vector coefficients fulfills the rule. If no, then the method once again may proceed with swapping two vector coefficients of different groups for each other in accordance with the rule to be fulfilled. Accordingly, said swapping may be performed until the rule is fulfilled.

According to an exemplary embodiment of the third aspect of the invention, said swapping a vector component of the first subvector for a vector component of the second subvector comprises: determining a first vector component of a first group of vector component, wherein the first vector component does not fulfill the rule, determining a second vector component of a second group of vector components, wherein the first group of vector components would fulfill the rule when the first vector component of the first group of vector components is swapped for the second vector component of the second group of vector components, and swapping the first vector component of the first subvector for the second vector component of the second subvector.

According to an exemplary embodiment of the third aspect of the invention, information being configured to determine the input vector comprising the plurality of vector components based on the at least two groups of vector components is determined.

For instance, said information may comprise information on the optional swapping performed between the vector components of different groups of the at least two groups of vector components. Accordingly, as an example, at a receiver said swapping may be done in a reverse order in order to obtain the initial two groups of at least two groups of vector components, which may not fulfill the rule but which can be used to reconstruct the input vector. For instance, defining said initial at least two groups of vector components based on the plurality of vector components may be performed in a predefined manner, wherein this predefined manner may be known to the receiver.

This information being configured to determine the input vector comprising the plurality of vector components based on the at least two groups of vector components may be included as additional information in said second quantized representation of the input vector.

Or, as another example, if the initial mapping of vector components of the plurality of vector components of the input vector to the at least two groups of vector components in the third aspect has been performed in a way that the vector components are mapped to the at least two groups of vector components in accordance with the rule based on energy values associated with the vector components (i.e., without said swapping), the information configured to determine the input vector comprising the plurality of vector components based on the at least two dequantized groups of vector components may be indicative of this mapping.

For instance, the grouping mentioned above may be considered as a grouping without using the grouping of a preceding input vector, since information on the grouping of a preceding input vector into at least two groups of vector components may not be considered for grouping the input vector into at least two groups of vector components.

According to an exemplary embodiment of the third aspect of the invention, said grouping the plurality of vector components of an input vector is performed based on a grouping of plurality vector components of a preceding input vector.

For instance, if the present input vector represents an n-th input vector, said preceding input vector may represent the n−1 input vector. It is assumed, a grouping of the plurality of vector components of the preceding input vector has been performed in accordance with the third aspect of the invention.

As an example, said grouping of the present input vector may be initially performed in a same way as the grouping performed with respect to the preceding input vector. Then, it may be checked whether the rule is fulfilled.

If the rule is fulfilled, this grouping of the present input vector is performed in the same way as in the preceding input vector, i.e., no changes may be performed with respect to the initial grouping. Thus, for example, no additional information on this grouping must be transmitted, e.g., said above-mentioned information being configured to determine the input vector comprising the plurality of vector components based on the at least two groups of vector components, since the receiver can use the same degrouping for the present input vector as for the preceding input vector. For instance, said absence of transmitting additional information on this grouping may include transmitted said information being configured to determine the present input vector, wherein this information may indicate that no change of the swapping is performed.

If the rule is not fulfilled, for instance, based on the initially performed grouping into said at least two groups of vector components vector components between two different groups of vector components of said initially grouped at least two groups of vector components are swapped for each other until the rule is fulfilled. Then, as an example, only the information on this swapping performed on vector components of said initially grouped at least two groups of vector component may be transmitted as said above-mentioned information being configured to determine the input vector comprising the plurality of vector components based on the at least two groups of vector components, since the receiver can use the initially grouping of said preceding input vector and then can perform said further grouping based on the information being configured to determine the present input vector.

Thus, said information being configured to determine the present input vector may be considered as a differential grouping information being indicative of changes in the grouping of the at least two groups of vector components of the present input vector with respect to the grouping of the at least two groups of vector components of the preceding input vector.

For instance, if said grouping of the at least two groups of vector components of the preceding input vector comprises at least one swap between a pair of vector components between two different groups of vector components, then said least one swap may be performed in order to initially group the at least two groups of vector components of the present input vector. If the rule is not fulfilled, said at least one swap may be swapped back with respect to the at least two groups of vector components of the present input vector, and it may be determined at least one new swap between vector components of back-swapped at least two different groups of vector components in order to obey the rule, where each swap of the at least one new swap may swap a vector component of a first group of vector components for a vector component of a second group of vector components.

Furthermore, it may be checked whether it is superior to transmit the differential grouping information being indicative of changes in the grouping of the at least two groups of vector components of the present input vector with respect to the grouping of the at least two groups of vector components of the preceding input vector or to transmit information being configured to determine the input vector comprising the plurality of vector components based on the at least two groups of vector components is determined being independent from the grouping of a preceding vector, which may be denoted as absolute grouping information.

For instance, the bits needed for coding of the differential grouping information may be compared with the bits needed for coding the absolute grouping information and it is selected the one which needs less bits for coding as information being configured to determine the input vector comprising the plurality of vector components. Furthermore, for instance, side information concerning the type of grouping, i.e., differential grouping or absolute grouping, might be transmitted.

According to an exemplary embodiment of the third aspect of the inventions, said grouping of the input vector in at least two groups of vector components based on the grouping performed with respect to the preceding input vector may be performed as a first grouping resulting in at least two first groups of vector components and said grouping of the input vector in at least two groups of vector components without using the grouping of the preceding input vector may be performed as a second grouping resulting in at least two second groups of vector components.

I.e., both the at least two first groups of vector components and the at least two second groups of vector components fulfill the rule, but may differ from each other due to the different grouping applied to the vector components. Then, as an example, a first quantized representation may be determined for each of the at least two first groups of vector components, as mentioned above, and a second quantized representation may be determined for each of the at least two second groups of vector components, as mentioned above, and then it may be checked whether the first quantized representations provide less distortion with respect to the input vector than the second quantized representations. If yes, the first grouping is selected and the first quantized representations of the at least two first groups of vector components are selected as quantized representations of the group of vector components. If no, the second grouping is selected and the second quantized representations of the at least two second groups of vector components are selected as quantized representations of the group of vector components.

Furthermore, for instance, said information being configured to determine the present input vector may be provided and/or transmitted to a receiver, as mentioned above with respect any of the embodiments, wherein this information being configured to determine represents the information corresponding to the selected grouping.

According to an exemplary embodiment of the third aspect of the invention, wherein said determining, for at least one of the at least two groups of vector components, a quantized representation of the respective group of vector components based on a codebook associated with the group of vector components is performed for each of the at least one of the at least two groups of vector components in accordance with the first aspect of the invention, wherein the input vector of the first aspect of the invention represents the respective group of vector components of the at least one of the at least two groups of vector components to be quantized.

According to an exemplary embodiment of the third aspect of the invention, said aspect forms part of a Third Generation Partnership Project speech and/or audio codec, in particular an Enhanced Voice Service codec.

According to an exemplary embodiment of the third aspect of the invention, the input vector represents a first input vector, wherein said at least one memory and said computer program code configured to, with said at least one processor, cause said apparatus further to perform: grouping a plurality of vector components of a second input vector into at least two groups of vector components in accordance with the grouping performed on the plurality of vector components of the first input vector, and determining, for at least one of the at least two groups of vector components associated with the second input vector, a quantized representation of the respective group of vector components based on a codebook associated with the group of vector components.

Accordingly, the vector components of the second input vector are grouped on the at least two groups of vector components associated with the second input vector in a same way as the grouping of the vector components of the first input vector on vector components on the at least two groups of vector components associated with the first input vector, i.e., the mapping of the vector components of the first input vector on the vector components on the at least two groups of vector components associated with the first input vector is used for mapping the vector components of the second input vector on vector components of the at least two groups of vector components associated with the second input vector.

For instance, this mapping may represent said initial mapping of vector components of the plurality of vector components of the first input vector to the at least two groups of vector components associated with the first input vector which is performed in a way that the vector components are mapped to the at least two groups of vector components in accordance with the rule based on energy values associated with the vector components, i.e., this initial mapping algorithm may consider the rule when mapping the vector components of the plurality of vector components to the at least two groups of vector components.

Or, for instance, said mapping may represent said initial mapping and, if performed, said at least one swap between a vector component of a first group of the at least two groups of vector components for a vector component of a second group of the at least two groups of vector components.

Thus, the information configured to determine the first input vector comprising the plurality of vector components based on the at least two groups of vector components associated with the first input vector may also be used for determining the second input vector comprising the plurality of vector components based on the at least two groups of vector components associated with the second input vector. Furthermore, it may be not necessary to transmit this information with respect to the second input vector since the grouping remains unchanged with respect to the first input vector and the receiver can user the grouping of the first input vector.

Afterwards, the at least two further groups of vector components are quantized as described with respect to at least two groups of vector components associated with the first input vector.

For instance, the second input vector may represent the input vector directly succeeding the first input vector. As an example, the grouping scheme applied to the first input vector may be stored and may be applied for at least one succeeding input vector in order to group each of this at least one succeeding input vector on respective at least two further groups of vector components, wherein said at least two further groups of vector components are quantized as explained with respect to the at least two groups of vector components associated with the first input vector. For instance, this may be performed if there exists a correlation between succeeding input vectors.

According to a first exemplary embodiment of a fourth aspect of the invention, a method is disclosed, said method comprising dequantizing each quantized representation of a group of vector components of at least two groups of vector components, wherein dequantization for a respective quantized group of vector components is performed based on a codebook associated with the respective quantized group of vector components, determining a vector comprising a plurality of vector components based on the at least two dequantized groups of vector components and based on information being configured to determine the vector comprising the plurality of vector components based on the at least two dequantized groups of vector components.

According to a second exemplary embodiment of the fourth aspect of the invention, an apparatus is disclosed, which is configured to perform the method according to the fourth aspect of the invention, or which comprises means for dequantizing each quantized representation of a group of vector components of at least two groups of vector components, wherein dequantization for a respective quantized group of vector components is performed based on a codebook associated with the respective quantized group of vector components, means for determining a vector comprising a plurality of vector components based on the at least two dequantized groups of vector components and based on information being configured to determine the vector comprising the plurality of vector components based on the at least two dequantized groups of vector components.

According to a third exemplary embodiment of the fourth aspect of the invention, an apparatus is disclosed, comprising at least one processor and at least one memory including computer program code, the at least one memory and the computer program code configured to, with the at least one processor, cause the apparatus at least to perform the method according to the fourth aspect of the invention. The computer program code included in the memory may for instance at least partially represent software and/or firmware for the processor. Non-limiting examples of the memory are a Random-Access Memory (RAM) or a Read-Only Memory (ROM) that is accessible by the processor.

According to a fourth exemplary embodiment of the fourth aspect of the invention, a computer program is disclosed, comprising program code for performing the method according to the fourth aspect of the invention when the computer program is executed on a processor. The computer program may for instance be distributable via a network, such as for instance the Internet. The computer program may for instance be storable or encodable in a computer-readable medium. The computer program may for instance at least partially represent software and/or firmware of the processor.

According to a fifth exemplary embodiment of the fourth aspect of the invention, a computer-readable medium is disclosed, having a computer program according to the fourth aspect of the invention stored thereon. The computer-readable medium may for instance be embodied as an electric, magnetic, electro-magnetic, optic or other storage medium, and may either be a removable medium or a medium that is fixedly installed in an apparatus or device. Non-limiting examples of such a computer-readable medium are a RAM or ROM. The computer-readable medium may for instance be a tangible medium, for instance a tangible storage medium. A computer-readable medium is understood to be readable by a computer, such as for instance a processor.

For instance, this fourth aspect of the invention may be used for dequantizing the quantized representations of the groups of vector components obtained by any of the embodiments of the third aspect of the invention.

Each quantized representation of a group of vector components of at least two groups of vector components is dequantized. These quantized at least two groups of vector components may represent at least two quantized groups of vector components obtained by any of the embodiments of the third aspect of the invention.

Thus, said dequantizing of is performed in order to undo the corresponding quantizing of the third aspect of the invention, wherein each quantized group of vector components is dequantized in order to determine a respective dequantized group of vector component. As an example, this dequantizing may be performed in accordance with the third aspect of the invention.

Then, a vector comprising a plurality of vector components is determined based on the at least two dequantized groups of vector components based on information configured to determine the vector comprising the plurality of vector components based on the at least two dequantized groups of vector components. This information configured to determine the vector comprising the plurality of vector components based on the at least two dequantized groups of vector components may represent the information configured to determine the input vector comprising the plurality of vector components based on the at least two dequantized groups of vector components described in the third aspect of the invention may for instance be received at a receiver together with at least two dequantized groups of vector components.

For instance, if the initial mapping of vector components of the plurality of vector components of the input vector to the at least two groups of vector components in the third aspect has been performed in a way that the vector components are mapped to the at least two groups of vector components in accordance with the rule based on energy values associated with the vector components, the information configured to determine the (input) vector comprising a plurality of vector components based on the at least two dequantized groups of vector components may be indicative of this mapping and, in accordance with the fourth aspect of the invention, the vector is obtained by performing a corresponding reverse mapping of vector coefficients of the at least two dequantized groups of vector coefficients to vector.

For instance, any explanations presented with respect to the third aspect of the invention may also hold for the fourth aspect of the invention.

According to an exemplary embodiment of the fourth aspect of the invention, said information being configured to determine the vector comprising the plurality of vector components based on the at least two dequantized groups of vector components comprises information on swapping performed between vector components of different groups of the at least two groups of vector components, the method comprising performing a re-swapping of vector components of different groups of the at least two dequantized groups of vector components in accordance with the information.

For instance, the fourth aspect of the invention may comprise a re-swapping of vector components between different groups of the at least two dequantized groups of vector components. As an example, the information may comprise information on swapping performed between vector components of different groups of the at least two groups of vector components, e.g., this information may comprise information on each swap performed by one of the embodiments of the third aspect of the invention defining of a vector component of a first group of the at least two groups of vector components for a vector component of a second group of the at least two groups of vector component. Thus, as an example, based on the information comprising information on swapping performed between vector components of different groups of the at least two groups of vector components, the swaps performed by the third aspect of the invention may be undone with respect to the at least two dequantized groups of vector components until the at least two dequantized groups of vector coefficients correspond to the initial at least two groups of vector components of the third aspect of the invention before the swapping has been performed. Then, based on these at least two dequantized groups of vector coefficients the first representation of the input vector can be obtained, e.g., by merging the at least two dequantized groups of vector coefficients together in order to undo the splitting of the plurality of vector components of the input vector performed at the third aspect of the invention.

For instance, if no swapping was necessary in the third aspect of the invention then this may for instance be indicated by the information being configured to determine the vector comprising the plurality of vector components based on the at least two dequantized groups of vector components and the at least two dequantized groups of vector coefficients may for instance be merged without any swap together for obtaining the input vector of the third aspect of the invention.

According to an exemplary embodiment of the fourth aspect of the invention, said dequantizing each quantized representation of a group of vector components of at least two groups of vector components is performed for each quantized representation of a group of vector components of at least two groups of vector components in accordance with one of the embodiments of the second aspect of the invention, wherein a respective quantized representation of a group of vector components comprises a first quantized representation of the respective group of vector components and a second quantized representation of the respective group of vector components.

According to an exemplary embodiment of the third aspect of the invention, said determining a representation of an vector based on the at least two dequantized groups of vector components based on information being configured to determine the vector comprising a plurality of vector components based on the at least two quantized groups of vector components is performed based on information being configured to determine a preceding vector comprising a plurality of vector components based on at least two quantized groups of vector components of the preceding vector.

For instance, said vector may be considered to represent a present vector, wherein the information being configured to determine the (present) vector may represent the abovementioned differential grouping information being indicative of changes in the grouping of the at least two groups of vector components of the present input vector with respect to the grouping of the at least two groups of vector components of the preceding input vector.

As an example, the same re-swapping may be performed with respect to the at least two dequantized groups of vector components of the present input vector is performed as for the re-swapping of the at least two dequantized groups of vector components of the preceding input vector. Accordingly, information being configured to determine a preceding vector comprising a plurality of vector components based on at least two quantized groups of vector components of the preceding vector is used for performing said re-swapping with respect to the present vector, wherein this re-swapping may represent in initially re-swapping.

Furthermore, if the information being configured to determine the present vector comprising a plurality of vector components based on the at least two quantized groups of vector components indicates that a further change of grouping (e.g., at least one swap) between at least two vector components of said at least two initially re-swapped groups of vector components of the present input vector is to be performed, said further grouping is performed in order to obtain the at least two dequantized groups of vector components in accordance with the representation of the present vector.

According to an exemplary embodiment of the fourth aspect of the invention, the vector represents a first vector, and wherein each quantized representation of a group of vector components of at least two further groups of vector components are dequantized, wherein dequantization for a respective quantized group of vector components is performed based on a codebook associated with the respective further quantized group of vector components, and a representation of a second vector is determined based on the at least two further dequantized groups of vector components based on the information being configured to determine the first vector comprising a plurality of vector components based on the at least two dequantized groups of vector components.

Said dequantization for a respective quantized group of vector components of said at least two further groups of vector components is performed as described with respect to the dequantization of the groups of vector components associated with the first vector.

When determining the representation of the second vector based on the at least two further dequantized groups of vector components the same information can be used as for the first vector, since it is assumed that grouping the plurality of vector components of the second (input) vector into at least two groups of vector components associated with the second (input) vector has been performed in accordance with the grouping performed on the plurality of vector components of the first (input) vector.

Thus, as an example, no additional information on the grouping of vector coefficients of the second vector on the at least two further groups of vector coefficients is necessary as the information being configured to determine the first vector comprising a plurality of vector components can be used in the same manner for determining the second vector based on the at least two further groups of vector components.

Other features of all aspects of the invention will be apparent from and elucidated with reference to the detailed description of embodiments of the invention presented hereinafter in conjunction with the accompanying drawings. It is to be understood, however, that the drawings are designed solely for purposes of illustration and not as a definition of the limits of the invention, for which reference should be made to the appended claims. It should further be understood that the drawings are not drawn to scale and that they are merely intended to conceptually illustrate the structures and procedures described therein. In particular, presence of features in the drawings should not be considered to render these features mandatory for the invention.

BRIEF DESCRIPTION OF THE FIGURES

In the figures show:

FIG. 4a: a flowchart of a third example embodiment of a method according to the first aspect of the invention;

FIG. 4b: an example of a plurality of set of basis codevectors;

FIG. 4c: an example process of determining a codevector;

FIG. 4d: a flowchart of a first example embodiment of a method according to a second aspect of the invention;

DETAILED DESCRIPTION OF EMBODIMENTS OF THE INVENTION

Figure 1A:
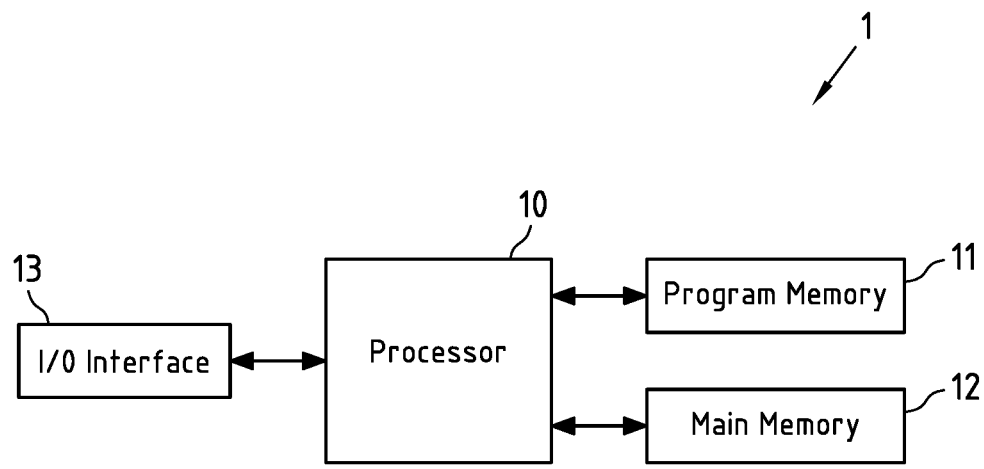
FIG. 1a: A schematic illustration of an example embodiment of an apparatus according to an aspect of the invention.

FIG. 1a schematically illustrates components of an apparatus 1 according to an embodiment of the invention. Apparatus 1 may for instance be an electronic device that is for instance capable of encoding at least one of speech, audio and video signals, or a component of such a device. For instance, apparatus 1 may be or may form a part of a terminal.

Apparatus 1 may for instance be configured to determine a first quantized representation of an input vector, and to determine a second quantized representation of the input vector based on a codebook depending on the first quantized representation in accordance with a first aspect of the invention.

Alternatively, or, additionally, apparatus 1 may for instance be configured to determine a first quantized representation of an input vector, the first quantized representation comprising a plurality of vector components, to group said plurality of vector components into at least two groups of vector components in accordance with a rule based on energy values associated with the vector components, wherein each group of the at least two groups of vector components comprises at least one vector component of the plurality of vector components, and to determine, for at least one of the at least two groups of vector components, a quantized representation of the respective group of vector components based on a codebook in accordance with a third aspect of the invention.

Apparatus 1 may for instance be embodied as a module. Non-limiting examples of apparatus 1 are a mobile phone, a personal digital assistant, a portable multimedia (audio and/or video) player, and a computer (e.g. a laptop or desktop computer).

Apparatus 1 comprises a processor 10, which may for instance be embodied as a microprocessor, Digital Signal Processor (DSP) or Application Specific Integrated Circuit (ASIC), to name but a few non-limiting examples. Processor 10 executes a program code stored in program memory 11, and uses main memory 12 as a working memory, for instance to at least temporarily store intermediate results, but also to store for instance pre-defined and/or pre-computed databases. Some or all of memories 11 and 12 may also be included into processor 10. Memories 11 and/or 12 may for instance be embodied as Read-Only Memory (ROM), Random Access Memory (RAM), to name but a few non-limiting examples. One of or both of memories 11 and 12 may be fixedly connected to processor 10 or removable from processor 10, for instance in the form of a memory card or stick.

Processor 10 further controls an input/output (I/O) interface 13, via which processor receives or provides information to other functional units.

As will be described below, processor 10 is at least capable to execute program code for providing the first and/or second and/or third and/or fourth aspect of the invention. However, processor 10 may of course possess further capabilities. For instance, processor 10 may be capable of at least one of speech, audio and video encoding, for instance based on sampled input values. Processor 10 may additionally or alternatively be capable of controlling operation of a portable communication and/or multimedia device.

Apparatus 1 of FIG. 1a may further comprise components such as a user interface, for instance to allow a user of apparatus 1 to interact with processor 10, or an antenna with associated radio frequency (RF) circuitry to enable apparatus 1 to perform wireless communication.

The circuitry formed by the components of apparatus 1 may be implemented in hardware alone, partially in hardware and in software, or in software only, as further described at the end of this specification.

Figure 1B:
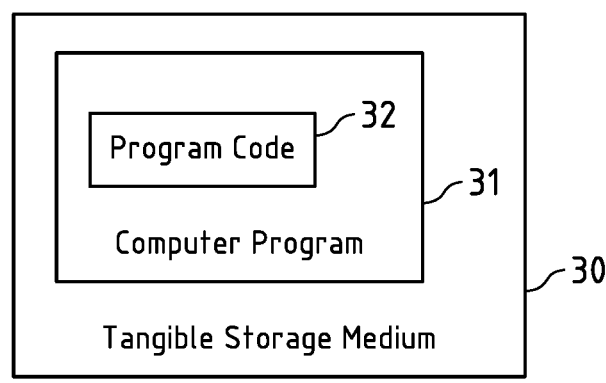
FIG. 1b: a tangible storage medium according to an embodiment of the invention.

FIG. 1b is a schematic illustration of an embodiment of a tangible storage medium 20 according to the invention. This tangible storage medium 20, which may in particular be a non-transitory storage medium, comprises a program 21, which in turn comprises program code 22 (for instance a set of instructions). Realizations of tangible storage medium 20 may for instance be program memory 12 of FIG. 1a. Consequently, program code 22 may for instance implement the flowcharts of FIGS. 2, 3, 4a, 4d, 5, 6 and 7 associated with one aspect of the first, second, third and fourth aspect of the invention discussed below.

FIG. 2a shows a flowchart 200 of a method according to a first embodiment of a first aspect of the invention. The steps of this flowchart 200 may for instance be defined by respective program code 32 of a computer program 31 that is stored on a tangible storage medium 30, as shown in FIG. 1b. Tangible storage medium 30 may for instance embody program memory 11 of FIG. 1a, and the computer program 31 may then be executed by processor 10 of FIG. 1a.

In a step 210, a first quantized representation of an input vector is determined. For instance, said first quantized representation may represent a quantized vector of the input vector. As an example, this quantized vector may comprise a plurality of bits, but any other well-suited quantized representation of the input vector may be used for the first quantized representation.

As a non-limiting example, the input vector may represent a vector comprising Line Spectral Frequencies (LSF) of an input signal, wherein this input signal may represent at least a part audio signal, e.g. a part of a voice signal or a part of a non-voice signal, wherein this audio signal may comprise voiced and/or unvoiced and/or generic and/or transition and/or CNG parts. For instance, the input signal to be quantized may represent residual data of an audio signal to be encoded, e.g. a residual of a Line Spectral Frequency (LSF) vector.

As an example, the first quantized representation may be determined by means of a first quantization stage being performed based on a plurality of codevectors. This plurality of codevectors of the first quantization stage may represent a first stage codebook.

For instance, the first quantized representation may represent the codevector selected from the plurality of codevectors for quantizing the input vector. As another example, the first quantized representation may represent an identifier of the selected codevector, wherein this identifier may represent a codevector index. Thus, for instance, if the first quantized representation may comprise n bits, the first stage codebook may comprise a maximum of $2^n$ codevectors.

In a step 220, a second quantized representation of the input vector is determined based on a codebook depending on the first quantized representation.

For instance, it may be assumed that this second quantized representation is performed by means of a second quantization stage. This second quantization stage may perform a quantization based on a plurality of codebooks, wherein each of this plurality of codebooks comprises at least one codevector.

The codebook used for the quantization of the input vector in the second stage depends on the first quantized representation. Thus, as an example, the codebook used in the second stage may be selected from the plurality of codebooks of the second stage based on the first quantized representation of the input vector.

For instance, there may be defined a mapping between a codevector of the plurality of codevectors of the first stage and a codebook of the plurality of codebooks of the second stage. Accordingly, such a mapping may be defined for each codevector of the plurality of codevectors of the first stage and a respective codebook of the plurality of codebooks of the second stage. Thus, based on the first quantized representation of the input vector, wherein this first quantized representation may represent the codevector selected in the first stage or may represent in indicator of the codevector selected in the first stage, the codebook for performing quantization in the second stage may be selected from the plurality of codebooks of the second stage.

This may show the advantage that specific codebooks may be defined for the second stage, wherein each specific codebook is adapted to the quantization performed in the first stage. Thus, at least one codebook of the plurality of codebooks of the second stage may represent a specific codebook tuned for the particular residual data associated with this codebook to be encoded which may improve the coding efficiency.

For instance, the codebooks of the second stage may represent lattice codebooks.

As an example, the first quantized representation of the input vector may represent a codevector index being indicative of the codevector selected in the first stage. Then, in step 220, a codebook of the plurality of codebooks is selected which is associated with the codevector index of the first quantized representation. For instance, each codevector index of first stage may be associated with a corresponding codebook of the plurality of codebooks of the second stage.

Then, in step 220, based on the selected codebook, a codevector of the selected codebook may be determined, e.g. based on a distortion metric. For instance, the codevector of the selected codebook may be determined for quantizing the input vector having the lowest distortion with respect to the input vector, wherein the distortion is determined based on the distortion metric. As an example, the distortion metric may represent a distance between the codevector and the input vector. For instance, a Hamming distance or an Euclidean distance or any other distance may be used.

Figure 3:
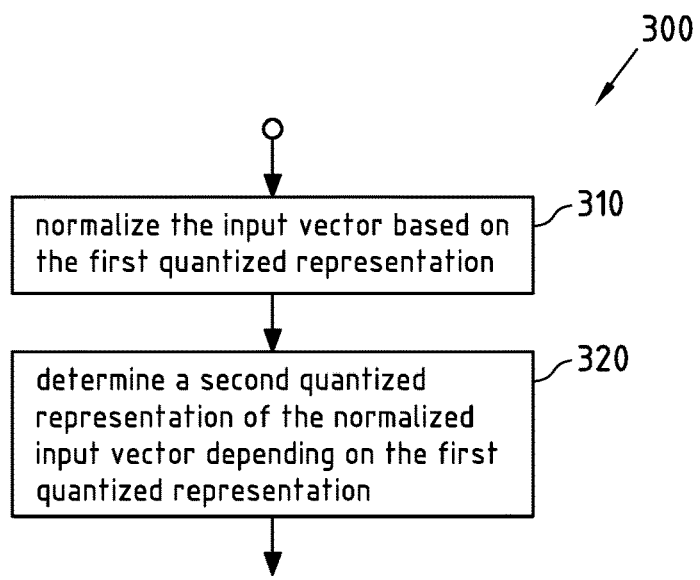
FIG. 3: a flowchart of a second example embodiment of a method according to the first aspect of the invention.

FIG. 3 depicts a flowchart 300 of a second example embodiment of a method 300 according to the first aspect of the invention. The steps of this flowchart 300 may for instance be defined by respective program code 32 of a computer program 31 that is stored on a tangible storage medium 30, as shown in FIG. 1b. Tangible storage medium 30 may for instance embody program memory 11 of FIG. 1a, and the computer program 31 may then be executed by processor 10 of FIG. 1a.

Figure 2:
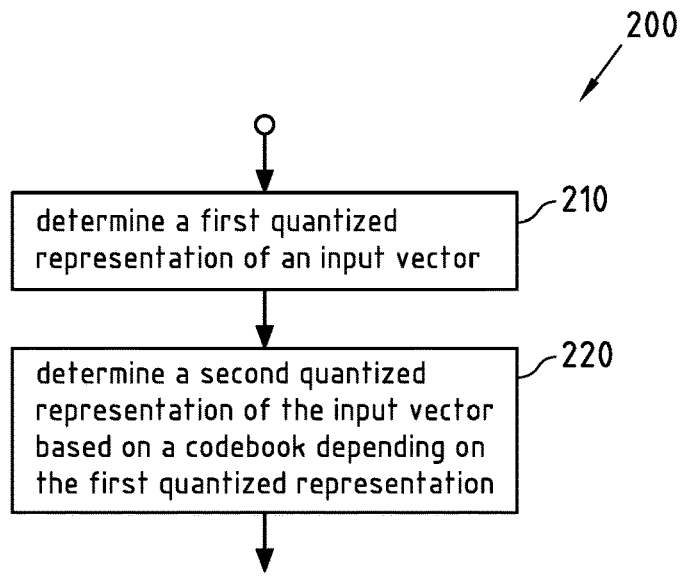
FIG. 2: a flowchart of a first example embodiment of a method according to a first aspect of the invention.

For instance, this method 300 may be used for determining the second quantized representation of the input vector in step 220 of method 200 depicted in FIG. 2.

In a step 310, the input vector is normalized based on the first quantized representation. For instance, said normalizing may comprise multiplying the vector components of the input vector with normalization coefficients in order to obtain a normalized representation of the input vector, where the normalization coefficients depend on the first quantized representation of the input vector.

The normalization is performed based on the first quantized representation. For instance, there may be defined a plurality of sets of normalization coefficients, each set of normalization coefficients comprising at least one normalization coefficient to be used for normalizing the input vector, wherein one set of normalization coefficients is selected from the plurality of sets of normalization coefficients based on the first quantized representation of the input vector.

For instance, there may be defined a mapping between a codevector of the plurality of codevectors of the first stage and a set of normalization coefficients of the plurality of sets of normalization coefficients. Accordingly, such a mapping may be defined for each codevector of the plurality of codevectors of the first stage and a respective set of normalization coefficients of the plurality of normalization coefficients. Thus, based on the first quantized representation of the input vector, wherein this first quantized representation may represent the codevector selected in the first stage or may represent in indicator of the codevector selected in the first stage, the set of normalization coefficients for performing normalization of the input vector in step 310 may be selected from the plurality of sets of normalization coefficients.

As an example, if the input vector comprises n vector coefficients, a set of normalization coefficients may comprise n normalization coefficients. Then, normalization of the input vector may be performed by multiplying a vector component of the plurality of vector components of the input vector with an associated normalization coefficient of the selected set of normalization coefficients. This may be performed for each vector component of the input vector, wherein a respective vector component is multiplied with the respective normalization coefficients of the set of normalization coefficients in order to obtain a normalized representation of the input vector.

As an example, the first quantized representation of the input vector may represent a codevector index being indicative of the codevector selected in the first stage. Then, in step 310, a set of normalization coefficients of the plurality of sets of normalization coefficients is selected which is associated with the codevector index of the first quantized representation. For instance, each codevector index of first stage may be associated with a corresponding set of normalization coefficients of the plurality of sets of normalization coefficients.

Then, in a step 320 the second quantized representation of the normalized input vector is determined depending on the first quantized representation. Determining the second quantized representation in step 320 may be performed as described with respect to step 220 in FIG. 2, wherein the input vector used in step 220 is replaced with the normalized input vector obtained in step 310.

FIG. 4a depicts a flowchart 400 of a third example embodiment of a method 400 according to the first aspect of the invention. The steps of this flowchart 400 may for instance be defined by respective program code 32 of a computer program 31 that is stored on a tangible storage medium 30, as shown in FIG. 1b. Tangible storage medium 30 may for instance embody program memory 11 of FIG. 1a, and the computer program 31 may then be executed by processor 10 of FIG. 1a.

For instance, this method 400 may be used for determining the second quantized representation of the input vector in step 220 of method 200 depicted in FIG. 2 or for determining the second quantized representation of the normalized input vector in step 320 in FIG. 3.

In a step 410, a codebook is selected of a plurality of codebooks based on the first quantized representation. For instance, this selection may be performed as explained with respect to the first example embodiment of a method 200.

Each codebook of the plurality of codebooks is defined by an associated set of basis codevectors and an associated at least one scale representative.

Each set of basis codevectors comprises at least one basis codevector. Since each set of basis codevectors is associated with at least one scale representative of a plurality of scale representatives, a codevector can be determined based on a basis codevector of a set of potential basis codevectors and a scale representative of the at least one scale representative associated with the set of potential basis codevectors, i.e. the codevector may be represented based on a basis codevector scaled by the respective scale representative. For instance, the scale representative may represent a scale value, wherein a codevector may be determined based on a multiplication of a basis codevector and the respective scale value.

For instance, at least one set of basis codevectors is associated with at least two scale representatives.

Accordingly, as an example, a codebook may comprise a set of codevectors comprising codevectors based on the plurality of sets of basis codevectors and based on the respective at least one scale value associated with a respective set of basis codevectors of the plurality of basis codevectors. This set of codevectors may comprise, for each basis codevector of each set of basis codevectors and for each of the at least one scale representative associated with a respective set of basis codevectors, a codevector based on the respective basis codevector scaled by the respective scale representative.

For instance, said sets of basis codevectors may represent leader classes, wherein each leader class comprises a different leader vector and permutations of said leader vector. Thus, said leader vector and the permutations of said leader vector may represent the basis codevectors of the respective set of basis codevectors.

The plurality of sets of basis codevectors may represent a subset of a second plurality of sets of basis codevectors. For instance, under the assumption that each set of basis codevectors represents a leader class, the plurality of leader classes may represent a subset of a second plurality of leader classes. Thus, the plurality of leader classes may be considered as a truncated plurality of leaders classes with respect to the second plurality of leader classes.

FIG. 4b depicts an example of a plurality of set of basis codevectors, wherein each $b_x$, with $x \in \{0, 1, \ldots X-1\}$, represents a set of basis codevector of the plurality of sets of basis codevectors, wherein X represent the number of sets of the plurality of sets of basis codevectors. Each set of basis codevectors is associated or comprises at least one basis codevector $b_{x,y}$, wherein $B_x$ represents the number of basis codevectors of a respective set of basis codevectors $b_x$, i.e. $y \in \{0, 1, \ldots B_x-1\}$ holds. For instance, the number $B_x$ of basis codevectors of a set of basis codevectors may be different for different sets of basis codevectors and/or it may be the same for at least two sets of basis codevectors.

FIG. 4c depicts an example process of determining a codevector $c_{x,z,y}$ based on basis codevector $b_{x,y}$ and based on a scale representative $s_z$, wherein index z represents the index of the respective scale representative of the plurality of scale representatives $s_0 \ldots s_{s-1}$, i.e. $z \in \{0, 1, \ldots S-1\}$ holds.

For instance, in case the values $b_{x,y,t}$ of the basis codevectors $b_{x,y}=[b_{x,y,0}, b_{x,y,1}, \ldots, b_{x,y,n-1}]$ represent absolute values, wherein to $\{0, 1, \ldots n-1\}$ holds and n represents the length of the respective basis codevector $b_{x,y}$, and if the absolute valued input vector is used for determining the potential codevector of a respective set of basis codevectors, the sign of each value $b_{x,y,t}$ at the (t+1)th position of the determined nearest basis codevector $b_{x,y}$ may be assigned based on the sign of the respective value $i_t$ at the (t+1)th position of the input vector i, before determining a codevector $c_{x,z,y}$ based on basis codevector $b_{x,y}$ and based on a scale representative $s_z$ is performed, as exemplarily depicted in FIG. 2c. As an example, if $i=[i_0, i_1, \ldots, i_{n-1}]$ represents the input vector, the absolute valued input vector may be represented by $[|i_0|, |i_1|, \ldots, |i_{n-1}|]$.

For instance, the sign of each value $b_{x,y,t}$ at the (t+1)th position of the determined nearest basis codevector $b_{x,y}$ may be assigned to the sign of the respective value $i_t$ at the (t+1)th position of the input vector, respectively, wherein this may hold if the parity of the basis codevectors $b_{x,y}$ of the set of basis codevectors $b_x$ is 0. As another example, if the parity of the basis codevectors $b_{x,y}$ of the set of basis codevectors $b_x$ is -1, the signs of the values $b_{x,y,t}$ of the potential basis codevector may be assigned corresponding to the signs of the values of the input vector at the same position in the vector, respectively, and if there are not an odd number of negative components, the value $b_{x,y,t}$ in the potential basis codevector having the lowest non-null absolute value may change its sign. Or, as another example, if the parity of the basis codevectors $b_{x,y}$ of the set of basis codevectors $b_x$ is +1, the signs of the values $b_{x,y,t}$ of the potential basis codevector may be assigned corresponding to the signs of the values of the input vector at the same position in the vector, respectively, and if there are not an even number of negative components, the value $b_{x,y,t}$ in the potential basis codevector having the lowest non-null absolute value may change its sign As a non-limiting example, a codevector $c_{x,z,y}$ may be determined based on a basis codevector by $b_x$ and based on a scale representative $s_z$ by $c_{x,z,y}=[b_{x,y,0} \cdot s_z, b_{x,y,1} \cdot s_z, \ldots, b_{x,y,n-1} \cdot s_z]$.

Each of the scale representatives $s_z$, wherein $z \in \{0, 1, \ldots S-1\}$ holds, is associated with at least one set of basis codevectors. For instance, as a non-limiting example this respective at least one set of basis codevectors may be represented by the set of basis codevectors $b_x$, with $x \in \{0, 1, \ldots n_z-1\}$, wherein $n_z$ may represent the number of sets of basis codevectors associated with the respective scale representative $s_z$, wherein $0 < n_z < X$ holds. Based on this linkage between a respective scale representative $s_z$ and the associated at least one set of basis codevectors $b_x$, with $x \in \{0, 1, \ldots n_z-1\}$, the associated at least one set of codevectors $c_{x,z,y}$, with $x \in \{0, 1, \ldots n_z-1\}$ and $y \in \{0, 1, \ldots B_x-1\}$ and $z \in \{0, 1, \ldots S-1\}$, can be determined.

Thus, as an example, a codebook structure of the above mentioned codebook may be defined by the plurality of scale representatives $s_z$, the plurality of sets of basis codevectors $b_x$, and the linkage between each scale representative with the associated at least one set of basis codevectors.

Since at least one set of basis codevectors, e.g. at least the set of basis codevectors $b_0$, is associated with at least two scale representatives, the same set of basis codevectors can be used to construct codevectors of the at least one set of codevectors associated with a first scale representative and to construct codevectors of the at least one set of codevectors associated with at least one further scale representative.

For instance, the codebooks of the plurality of codebooks of step 410 may be defined based on the above-mentioned second plurality of leader classes, wherein each leader class of the second plurality of leader classes is associated with a different leader vector, and wherein a set of basis codevector associated with a respective leader class may be represented by the respective leader vector and permutations of the this leader vector. Then, as an example, each codebook of the plurality of codebooks may be defined by at least one truncation associated with a respective codebook, wherein each truncation of the at least one truncation associated with a respective codebook is associated with at least one leader class of the second plurality of leader classes and with a respective scale representative such that the leader class vector of the respective leader class scaled with respective scale representative and permutations of this scaled leader class vector represent codevectors of the respective truncation of the at least one truncation of the respective codebook.

As a non-limiting example, an example of 16 exemplary leader classes may be defined by:
float p1[ ]={1, 1, 0, 0, 0, 0, 0, 0,
 0.5, 0.5, 0.5, 0.5, 0.5, 0.5, 0.5, 0.5,
 1, 1, 1, 1, 0, 0, 0, 0,
 2, 0, 0, 0, 0, 0, 0, 0,
 1.5, 0.5, 0.5, 0.5, 0.5, 0.5, 0.5, 0.5, //5
 1, 1, 1, 1, 1, 1, 0, 0,
 2, 1, 1, 0, 0, 0, 0, 0,
 1.5, 1.5, 0.5, 0.5, 0.5, 0.5, 0.5, 0.5,
 1, 1, 1, 1, 1, 1, 1, 1,
 2, 1, 1, 1, 1, 0, 0, 0, //10
 2, 2, 0, 0, 0, 0, 0, 0,
 1.5, 1.5, 1.5, 0.5, 0.5, 0.5, 0.5, 0.5,
 2.5, 0.5, 0.5, 0.5, 0.5, 0.5, 0.5, 0.5,
 2, 1, 1, 1, 1, 1, 1, 0,
 2, 2, 1, 1, 0, 0, 0, 0, //15
 3, 1, 0, 0, 0, 0, 0, 0};

For instance, these 16 leader classes may define the above mentioned second plurality of sets of basis codevectors, wherein a codebook structure may be defined by a plurality of set of basis codevectors representing a subset of said second plurality of sets of basis codevectors.

As an example, a plurality of an example of 16 exemplary codebook structures may be defined as
int no_lead[ ][ ]={
 {8, 9, 3, 2, 2, 1},
 {10, 9, 3, 2, 2, 0},
 {7, 6, 2, 2, 3, 0},
 {2, 2, 1,10, 9, 2},
 {6, 2, 0, 5, 3, 0},
 {13, 3, 0, 2, 2, 0},
 {10, 9, 3, 2, 2, 0},
 {10, 9, 3, 2, 2, 0},
 {10, 9, 3, 2, 2, 0},
 {5, 3, 0, 6, 2, 0},
 {8, 5, 2, 4, 0, 0},
 {10, 9, 3, 2, 2, 0},
 {9, 9, 3, 2, 2, 2},
 {10, 9, 3, 2, 2, 0},
 {11, 9, 3, 2, 2, 0},
 {8, 10, 7, 2, 2, 01}};
wherein each vector no_lead[ ][l] (wherein $l \in \{0, 1, \ldots 16\}$ holds) defines a respective codebook structure comprising a plurality of truncations. For instance, with l=2 the vector no_lead[ ][2]=(10, 9, 3, 2, 2, 0) defines respective codebook structure signifying that the first truncation, i.e., the first union of leader classes, may be composed of the first 8 leader classes, the second one by the first 9 leader classes, the third one by the first 3 leader classes, and so on.

To each truncation of a respective codebook structure a respective scale representation may be assigned (e.g. through training), e.g.:
float scales[ ][16]={
 {0.947f, 1.574f, 2.432f, 1.281f, 2.249f, 5.562f},
 {0.887f, 1.635f, 2.626f, 1.263f, 2.736f, 0.0f},
 {1.005f, 1.683f, 3.539f, 1.071f, 1.895f, 0.0f},
 {1.055f, 2.491f, 6.473f, 0.959f, 1.930f, 2.455f,},
 {1.195f, 3.650f, 0.0f, 1.225f, 2.172f, 0.0f},
 {1.070f, 2.998f, 0.0f, 1.296f, 2.389f, 0.0f},
 {0.919f, 1.558f, 3.924f, 1.261f, 2.495f, 0.0f},
 {0.918f, 1.557f, 2.240f, 1.256f, 2.439f, 0.0f},
 {0.907f, 1.955f, 3.210f, 1.334f, 3.132f, 0.0f},
 {1.098f, 1.960f, 0.0f, 1.222f, 3.658f, 0.0f},
 {1.082f, 1.913f, 2.942f, 1.436f, 0.0f, 0.0f},
 {0.940f, 1.620f, 2.512f, 1.336f, 3.017f, 0.0f},
 {0.949f, 1.539f, 2.587f, 1.148f, 2.125f, 5.231f},
 {0.945f, 1.954f, 2.468f, 1.275f, 2.635f, 0.0f},
 {0.916f, 1.660f, 2.852f, 1.242f, 2.432f, 0.0f},
 {0.838f, 1.253f, 2.108f, 1.256f, 2.456f, 0.0f}};

Thus, as an example, an lth codebook of the plurality of codebooks may be defined by the plurality of truncations defined by the respective vector no_lead[ ][l] and the respective vector of scale representations scales[ ][l], wherein each truncation k no_lead[k][l] is scaled with a respective scale representation scales [k][l] associated with this truncation. Thus, a first set of codevectors of a plurality of codevectors of an lth codebook is defined by the first truncation scaled by the respective first scale representation, i.e., under the assumption of l=2 the first scale representation would be 0.887 in the above-mentioned example, a second set of codevectors of the plurality of codevectors lth codebook is defined by the second truncation scaled by the respective second scale representation, i.e., under the assumption of l=2 the second scale representation would be 1.635 in the above-mentioned example, and so on.

For instance, the number of codebooks of the plurality of codebooks may correspond to the number of codevectors of the first stage, wherein each codevector of the first stage is associated with a respective codebook of the second stage. As an example, the first quantized representation of the input vector may represent a codevector index being indicative of the codevector selected in the first stage. Then, in step 310, a corresponding codebook of the plurality of codebooks is selected based on the codevector index. For instance, each codevector index of first stage may be associated with a corresponding codebook of the second stage.

As a non limiting example, the codevector index may be denoted as 1 and the corresponding codebook may be defined by the a respective leader vector no_lead[ ][1[ ] and a respective vector of scale representations scales[ ][1].

Then, at a step 420 a second quantized representation of the input vector is determined based on the selected codebook.

It has to be understood, that this input vector may represent to normalized input vector or the non-normalized input vector.

For instance, said determining a second quantized representation of the input vector may comprise determining a codevector of the plurality of codevectors of the selected codebook which has a minor or minimum distortion compared to the input vector.

As an example, a distortion metric may be used for determining the distortion of a codevector and the input vector. For instance, said distortion metric may be based on any kind of suitable distance between a codevector and the input vector. As an example, a Hamming distance or an Euclidean distance or any other distance may be used. As an example, the codevector for which the distortion metric is to be calculated must not necessarily determined and the distortion metric may be calculated by inherently considering the respective codevector associated with the selected scale representation and the set of basis codevectors associated with this selected scale representation.

For instance, if $c_{x,z,y} = [c_{x,z,y,0}, c_{x,z,1}, \ldots, c_{x,z,n-1}]$ represents the codevector and $i = [i_0, i_1, \ldots, i_{n-1}]$ represents the input vector, a distance d may be calculated based on $$d = \sum_{k=0}^{n-1}(i_k - c_{x,z,y,k})^2. \quad (1)$$

As an example, the respective codevector represents an n-dimensional vector comprising codevector values $c_0 \ldots {}_{n-1}$ and the input vector represents an n-dimensional vector comprising input vector values $i_0 \ldots i_{n-1}$, wherein determining the respective distance d is performed based on calculating d'

$$d' = \sum_{k=0}^{n-1} c_k^2 - 2\sum_{k=0}^{n-1} i_k \cdot c_k. \quad (2)$$

This distortion metric (2) may be considered to represent a simplified metric of metric (1) without any loss of quality.

Furthermore, as an example, the distortion metric may be determined based on a weighting function.

For instance, the respective codevector represents an n-dimensional vector comprising codevector values $c_0 \ldots {}_{n-1}$ and the input vector represents an n-dimensional vector comprising input vector values $i_0 \ldots i_{n-1}$, wherein determining the respective distance $d_w'$ is performed based on calculating $$d_w' = \sum_{k=0}^{n-1} w_k \cdot c_k^2 - 2\sum_{k=0}^{n-1} w_k \cdot i_k \cdot c_k,$$

wherein $w_k$ represent weighting factors of the weighting function.

Accordingly, in step 420 a codevector of the plurality of codevectors may be determined based on the applied distortion metric, wherein this determining may for instance comprise calculating the distortion for at least one codevector of the plurality of codevectors, wherein the codevector of the at least one codevector is selected for quantization in step 420 which has the lowest distortion in accordance with the determined distortion metric. For instance, said at least one codevector may represent all codevectors of the plurality of codevectors of the selected codebook or a subset of codevectors of the plurality of codevectors of the selected codebook.

FIG. 4d shows a flowchart 400' of a first example embodiment of a method according to a second aspect of the invention. The steps of this flowchart 500 may for instance be defined by respective program code 32 of a computer program 31 that is stored on a tangible storage medium 30, as shown in FIG. 1b. Tangible storage medium 30 may for instance embody program memory 11 of FIG. 1a, and the computer program 31 may then be executed by processor 10 of FIG. 1a.

For instance, this method 400' may be used for dequantizing the input vector quantized by any of the methods of the first aspect of the invention.

At a step 430, a codebook of a plurality of codebooks is selected based on a first quantized representation of a vector. This first quantized representation may represent any of the first quantized representations of the input vector described with respect to the first aspect of the invention. This selection of a codebook may be performed as described with respect to the first aspect of the invention.

For instance, the plurality of codebooks represent the plurality of codebooks used in step 220 depicted in FIG. 2 or in step 410 depicted in FIG. 4, wherein the first quantized representation indicates the codebook which is used for the second stage quantization in the first aspect of the invention.

At a step 440, a second quantized representation of the vector is dequantized based on the selected codebook. This second quantized representation may represent any of the second quantized representations of the input vector described with respect to the first aspect of the invention.

Thus, step 440 performs a reverse quantization of the second stage quantization of the first aspect of the invention in accordance with the selected codebook. Accordingly, all explanations given with respect to the second stage quantization in the first aspect of the invention also hold for the dequantization performed in step 440.

The dequantized second quantized representation of the vector may then correspond to the input vector of the first aspect of the invention.

If a normalization of the input vector has been performed in the first aspect of the invention, method 400' may comprise reversing this normalization by selected a normalization representation based on the first quantized representation.

For instance, said input vector may comprise a plurality of vector components, and said reverse normalization may comprise dividing at least one vector component of the dequantized input vector with a respective normalization coefficient depending on the first quantized representation.

As an example, a set of normalization coefficients may be selected from a plurality of sets of normalization coefficients based on the first quantized representations, as described with respect to the first aspect of the invention, and wherein the respective normalization coefficient to be divided with respect to one of the at least one vector component of the dequantized input vector is from the selected set of normalization coefficients.

For instance, any explanations presented with respect to the first aspect of the invention may also hold for the second aspect of the invention.

Figure 5:
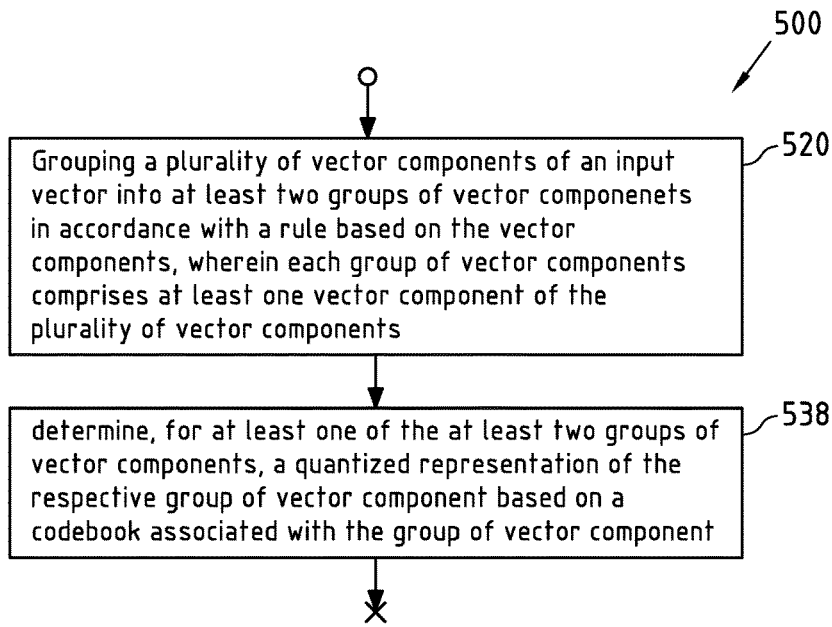
FIG. 5: a flowchart of a first example embodiment of a method according to a third aspect of the invention.

FIG. 5 shows a flowchart 500 of a method according to a first embodiment of a third aspect of the invention. The steps of this flowchart 500 may for instance be defined by respective program code 32 of a computer program 31 that is stored on a tangible storage medium 30, as shown in FIG. 1b. Tangible storage medium 30 may for instance embody program memory 11 of FIG. 1a, and the computer program 31 may then be executed by processor 10 of FIG. 1a.

For instance, in input vector comprising a plurality of vector coefficients may be provided, wherein this input vector may represent a vector quantization resulting in a residual vector representation, wherein the residual vector representation may represent the input vector. As a non-limiting example, the input vector may represent a vector comprising Line Spectral Frequencies (LSF) of an input signal, wherein this input signal may represent at least a part audio signal, e.g. a part of a voice signal or a part of a non-voice signal, wherein this audio signal may comprise voiced and/or unvoiced and/or generic and/or transition and/or CNG parts. For instance, the input signal to be quantized may represent residual data of an audio signal to be encoded.

As an example, the input vector may be defined as vector $i=[i_0, i_1, \ldots, i_k]$ comprising k vector components $i_x$ with $x \in \{0, 1, \ldots k-1\}$. It has to be understood that other representations may be used as well.

At a step 520, said plurality of vector components is grouped into at least two groups of vector components in accordance with a rule based on the vector components.

As an example, it may be defined that each group of the at least two groups of vector components comprises a predefined number of vector components. For instance, each vector component of the plurality of vector components may be associated with a respective group of the at least two groups of vector components, i.e., the vector components of the at least two groups of vector components represent the plurality of vector components, or, as another example, the vector components of the at least two groups of vector components may represent a subset of vector components of the plurality of vector components.

For instance, said rule may specify that the vector components of each of the at least two groups of vector components must fulfill a predefined energy characteristic. As an example, this rule may define that vector components of a group of the at least two groups of vector components may have similar energy values, and/or, for instance, said rule may specify that a first group of the at least two groups of vector components, this first group comprising $l_1 < k$ vector components, comprises the $l_1$ most or less energetic vector components of the plurality of vector components, whereas the remaining $k-l_1$ vector components of the plurality of vector components are associated with the remaining at least one group of the at least two groups of vector components not representing the first group of vector components.

For instance, said rule may represent a rule based on energy values associated with the vector components. As an example, the energy value associated with a respective vector component may for instance represent the energy value of the respective vector component, or a value being proportional to the energy value of the respective vector component, or an energy value representing the energy value of the respective vector component weighted with a weighting factor associated with this vector component, or a value being proportional to the energy value representing the energy value of the respective vector component weighted with a weighting factor associated with this vector component, or the energy rank of the respective vector component with respect to the energy ranks of the remaining vector components of the plurality of vector components. For instance, the vector component being associated with the lowest energy value of the plurality of vector components may be associated with the lowest energy rank, e.g. rank=1 or rank=k, and the vector component being associated with the highest energy value of the plurality of vector component may be associated with the highest energy rank, e.g. rank=k or rank=1. Thus, the energy rank of a vector component may indicate the position of the respective vector component with regard to its energy compared to energy of all other remaining vector components of the plurality of vector components.

The energy value $e_x$ of a vector component $i_x$ with $x \in \{0, 1, \ldots k-1\}$ may for instance be calculated based on $$e_x = i_x^2$$

or based on any other well-suited definition of an energy value.

If a vector component $i_x$ with $x \in \{0, 1, \ldots k-1\}$ is weighted with a corresponding weighting factor $w_x$, then the energy value weighted with the corresponding weighting factor might for instance be calculated based on $$e_x = w_x i_x^2.$$

Furthermore, as another example, said rule may be a rule based on a predefined norm associated with the vector components. This rule may define that vector components of a group of the at least two groups of vector components may fulfill a specific norm or are in predefined range based on the specific norm, wherein this norm for instance may represent a respective Lp-norm of a corresponding Lp-space, wherein $p \geq 1$ holds or any other well-suited norm.

For instance, the rule may define that a specific norm applied to the vector components of a first group of the at least two groups of vector components is within first predefined range, and that the specific norm applied to the vector components of a second group of the at least two groups of vector coefficients is within a second predefined range, and so on, wherein the first and second predefined range differ from each other.

As an example, the at least two groups of vector components represent n groups of vector components $g_x$ with $x \in \{1, 2, \ldots n\}$ with $n \geq 2$, wherein an xth group $g_x$ of the at least two groups of vector components comprises $l_x$ vector coefficients of the plurality of vector coefficients of the input vector, and wherein said rule specifies that the specific norm of the $l_x$ vector coefficients of an xth group $g_x$ is within a predefined range $r_x$ associated with this xth group $g_x$. Thus, a plurality of x ranges $l_x$ may be defined, wherein each range $r_x$ associated with a respective xth group $g_x$ may represent a different range.

For instance, if the specific norm represents the lp norm, and the $l_x$ vector coefficients of an xth group $g_x$ may be denoted as $g_{x,0}, g_{x,1}, \ldots, g_{x,lx-1}$, this norm may be calculated for the $l_x$ vector coefficients of an xth group $g_x$ as follows:

$$\left( \sum_{y=0}^{k-1} (g_{x,y})^p \right)^{\frac{1}{p}}$$

For instance, an l1 norm (i.e., p=1) may be used, or an l2 norm (i.e., p=2) may be used, or any other well-suited norm.

For instance, the grouping said plurality of vector components into at least two groups of vector components in step 520 may comprise an initialisation by an initial defining said at least two groups of vector components, wherein each of group of said at least two groups of vector components comprises at least one vector component of the plurality of vector components in accordance with an initial mapping of vector components of the plurality of vector components of the input vector to the at least two groups of vector components, and wherein vector components of different groups of the at least two groups of vector components are swapped between the different groups so long until the rule based on energy values associated with the vector components is fulfilled, i.e., until the vector components of each group of the at least two groups of vector components fulfill this rule.

Or, as another example, said initial mapping of vector components of the plurality of vector components of the first quantized representation to the at least two groups of vector components may be performed in a way that the vector components are mapped to the at least two groups of vector components in accordance with the rule based on energy values associated with the vector components. Thus, the mapping algorithm may consider the rule when mapping the vector components of the plurality of vector components to the at least two groups of vector components.

Accordingly, after the grouping in step 520 has been performed, the vector components of each group of the at least two groups of vector components fulfill the rule based on energy values associated with the vector components of the plurality of vector components.

At a step 530, for each group of at least one group of the at least two groups of vector components a quantized representation of the respective group of vector components is determined based on a codebook associated with the respective group of vector components. Accordingly, at least one quantized representation of at least one group of vector components is determined in step 530, wherein each of the at least one quantized representation of the at least one group of vector components is associated with a corresponding group of vector components of the at least one group of vector components. For instance, each group of the at least two groups vector components may be quantized in step 530.

For instance, the same codebook may be used for quantizing each of the at least one group of vector components in step 530.

Or, as another example, a codebook used for quantizing a group of vector components of the at least one group of vector components to be quantized in step 530 may be chosen from a plurality of codebooks depending on the codevectors of the respective group of vector components. Thus, for instance, a group of vector components comprising vector components being associated with lower/low energy values may be quantized based on a codebook optimized for low energy vector components, whereas a group of vector components comprising vector component being associated with higher/high energy values (e.g. higher energy values as the group of vector components comprising vector components being associated with lower/low energy values) may be quantized based on a codebook optimized for high energy vector components. Accordingly, for instance, a well-suited codebook for quantizing a respective group of at least one group of vector components to be quantized may be selected in step 530. Thus, as an example, due to fulfillment of the rule based on energy values associated with the vector components of the at least two groups of vector components the specific energy characteristic of a respective group of vector components may be used for selected a respective codebook of the plurality of codebooks, wherein codebooks of the plurality of codebooks may be optimized for different energy characteristics of vector components.

For instance, each of the at least one group of the at least two groups to be encoded in step 530 may be encoded by applying the two-stage quantization in accordance with the first aspect of the invention, i.e., as an example, step 530 comprise performing any of the methods 200, 300 and 400 of the first aspect for the invention for each of the at least one group of vector components, i.e., the respective group of vector components of the at least one group of vector components to be encoded in step 530 represents a respective input vector in accordance with the first aspect of the invention.

The at least one quantized representation of the at least one group of codevectors of the at least two groups of codevectors obtained in step 530 may be considered as a second quantized representation of the input vector in accordance with the first aspect of the invention.

Furthermore, as an example, method 500 may comprise determining information being configured to determine the (input) vector comprising the plurality of vector components based on the at least two groups of vector components. For instance, said information may comprise information on the swapping performed between the vector components of different groups of the at least two groups of vector components. Accordingly, as an example, at a receiver said swapping may be done in a reverse order in order to obtain the initial two groups of at least two groups of vector components, which may not fulfill the rule but which can be used to reconstruct the input vector. For instance, defining said initial at least two groups of vector components based on the plurality of vector components may be performed in a predefined manner, wherein this predefined manner may be known to the receiver.

This information being configured to determine the input vector comprising the plurality of vector components based on the at least two groups of vector components may be included as additional information in said second quantized representation of the input vector.

Figure 6:
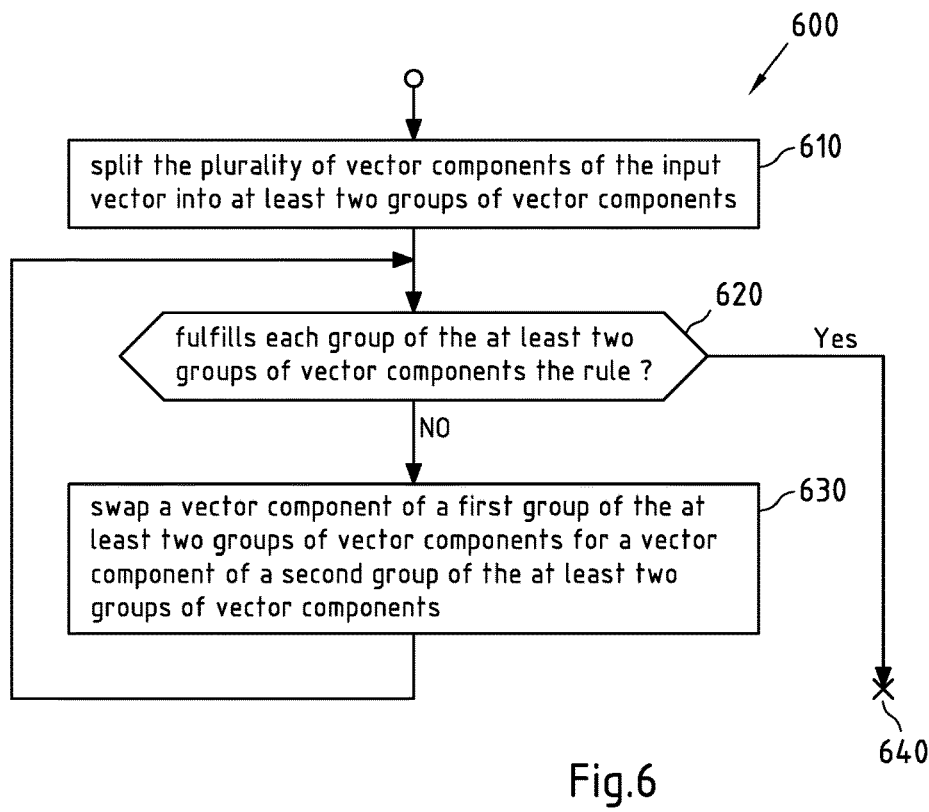
FIG. 6: a flowchart of a second example embodiment of a method according to a third aspect of the invention.

FIG. 6 shows an optional flowchart 600 of a method according to a second embodiment of the third aspect of the invention. This method 600 may for instance be used for grouping said plurality of vector components in at least two groups of vector components in step 510 of the method 500 according to a first embodiment of the third aspect of the invention. The steps of this flowchart 600 may for instance be defined by respective program code 32 of a computer program 31 that is stored on a tangible storage medium 30, as shown in FIG. 1b. Tangible storage medium 30 may for instance embody program memory 11 of FIG. 1a, and the computer program 31 may then be executed by processor 10 of FIG. 1a.

At a step 610 the plurality of vector components of the input vector are split into at the at least two groups of vector components. For instance, said splitting may represent an example of the above mentioned initial grouping of the vector components of the plurality of vector components in order to obtain the initial at least two groups of vector components, which may not fulfill the rule.

Under the assumption that the input vector may be defined as vector $i=[i_0, i_1, \ldots, i_k]$ comprising k vector components $i_x$ with $x \in \{0, 1, \ldots k-1\}$ said k vector components $i_0, i_1, \ldots, i_k$ are split into the at least two groups of the at least two groups of vector components in accordance with a predefined manner in step 610. For instance, a first initial group of the at least two groups of vector components may comprise 11 vector components, wherein this 11 vector components may represent the first $l_1$ vector components of the input vector representation, i.e., $i_0, \ldots, i_{l_1-1}$. The second group of vector components may comprise 12 vector components, wherein this 12 vector component may represent the 12 vector components of the plurality of vector components directly succeeding after the vector component of the preceding group of the second group, i.e., the first group of vector components, wherein this 12 vector components may represent $i_{l_1}, \ldots, i_{l_1+l_2-1}$. If the at least two groups of vector components represent more than two groups of vector components, then each of the further group of vector components comprises a number of neighboured vector components of the plurality of vector components, wherein said neighboured vector components are obtained through splitting the plurality of vector coefficients into said at least two groups of vector coefficients. For instance, each group of the at least two group may comprise the same number of vector coefficients, or, as another example, the number of vector coefficients may vary for different groups of the at least two groups of vector coefficients.

In the sequel, for instance, it may be assumed without any limitations that the input vector represents a vector comprising k vector components, wherein this vector is split into to groups $g_1$ and $g_2$ of vector components:

$$i = \left( \underbrace{i_0 \; \cdots \; i_{l_1-2} \; i_{l_1-1}}_{g_1} \; \underbrace{i_{l_1} \; i_{l_1+1} \; \cdots \; i_{l_1+l_2-1}}_{g_2} \right)$$

At a step 620, it is checked whether each group of the at least two groups of vector components fulfills the rule.

If each of the at least two groups fulfills the rule then there is no need for rearranging vector coefficients between two different groups of the at least two groups of vector coefficients and the method 600 may proceed at reference sign 640 where it may jump to 530 of method 500 depicted in FIG. 5.

If it is determined at step 620 that at least one group of the at least one group does not fulfill the rule the method 600 proceeds with swapping a vector component of a first group of the at least two groups for a vector component of a second group of the at least two groups of vector components in a step 630. This swapping is performed in way that the first group and the respective vector coefficient of the first group to be swapped and that the corresponding second group and the respective vector coefficient of the second group to be swapped are chosen based on the rule such that after the swapping the rule is fulfilled, or, if more than one couple of coefficients has to be swapped in order to fulfill the rule, that the selected vector coefficient of the selected first group and the selected vector coefficient of the selected second group represent one couple of coefficients of the more than one couple of coefficients to be swapped in order to fulfill the rule.

As an example, it may be necessary to swap $i_{l_1-1}$ of the first group of vector coefficients $g_1$ for $i_{l_1}$ of the second group of vector coefficients, wherein this swapping may result in rearranged groups of vector coefficients as follows:

$$i' = \left( \underbrace{i_0 \; \cdots \; i_{l_1-2} \; i_{l_1}}_{g_1} \; \underbrace{i_{l_1-1} \; i_{l_1+1} \; \cdots \; i_{l_1+l_2-1}}_{g_2} \right)$$

Thus, as an example, each group of said at least two groups of vector coefficients may be associated with fixed positions of vector i of the input vector, wherein said swapping may be performed by exchanging the positions of the vector coefficients to be swapped in vector i, wherein vector i' may represent the input vector after the swapping.

Then, it may be checked in step 620 whether each group of the at least two groups of vector coefficients fulfills the rule. If no, then the method once again proceeds with swapping two vector coefficients of different groups for each other. Accordingly, the loop defined in FIG. 6 by steps 620 and 630 may be performed until the rule is fulfilled in step 620.

For instance, it may be assumed that the said rule may specify that a first group of the at least two groups of vector components comprises the $l_1$ most energetic vector components (or the $l_1$ less energetic vector components) of the plurality of vector components, whereas the remaining $k-l_1$ vector components of the plurality of vector components are associated with the remaining at least one group of the at least two groups of vector components not representing the first group of vector components. Furthermore, as an example, in accordance with this rule, a second group of the at least two groups of vector components may comprise the $l_2$ most energetic vector components (or the $l_2$ less energetic vector components) of the remaining $k-l_1$ vector components of the plurality of vector components.

Thus, for instance, under the assumption that n groups of vector coefficients $g_x$ with $x \in \{1, 2, \ldots n\}$ are used, wherein an xth group $g_x$ comprises (or is associated with) $l_x$ vector coefficients of the plurality of vector coefficients of the the input vector, in accordance with the rule the $l_x$ vector coefficients of an xth group $g_x$ must represent the $$\left( \left( \sum_{y=1}^{x-1} l_y \right) + 1 \right) th \text{ to } \left( \left( \sum_{y=1}^{x-1} l_y \right) + l_x \right)$$

most energetic (or less energetic) vector coefficients of the plurality of vector coefficients.

Or, as another example, the above described rule based on a predefined norm may associated with the vector components may be applied.

For instance, the order of the vector coefficients within a respective group of the at least two groups may be irrelevant for the applied rule.

As another example, the input vector may comprise 16 vector coefficients and the at least two groups of vector components are exactly two groups of vector components, each of the two groups comprising 8 vector components, wherein initially the first group may comprise the first 8 vector components $i_0, \ldots, i_7$ and the second group may comprise the remaining 8 vector components $i_8, \ldots, i_{15}$ of the plurality of vector coefficients, e.g. obtained by step 610:

$$i = \left( \underbrace{i_0 \; i_1 \; i_2 \; i_3 \; i_4 \; i_5 \; i_6 \; i_7}_{g_1} \; \underbrace{i_8 \; i_9 \; i_{10} \; i_{11} \; i_{12} \; i_{13} \; i_{14} \; i_{15}}_{g_2} \right),$$

wherein the order of the energy values of the components may be in an example such that the rank of each component (corresponding the respective position in vector i) is:
1 4 5 6 2 9 3 7 11 12 10 8 13 14 15 16,
wherein 1 indicates that the respective vector component $i_0$ has the highest rank regarding the energy values of all vector components, and so on, i.e. 16 in indicates that vector component $i_{15}$ has the $16^{th}$ highest rank regarding the energy values.

Then, for instance, at step 620 it is checked whether the rule is fulfilled or each of the two groups of vector coefficients $g_1$ and $g_2$. E.g., the rule may represent the above mentioned rule that the $l_x$ vector coefficients of an xth group $g_x$ must represent the $$\left(\left(\sum_{y=1}^{x-1} l_y\right)+1\right)th \text{ to } \left(\left(\sum_{y=1}^{x-1} l_y\right)+l_x\right)$$

most energetic vector coefficients of the plurality of vector coefficients.

Accordingly, it is detected in step 620 that the first and second group do not fulfill this rule, since the first group $g_1$ does not comprise the 1th to $8^{th}$ most energetic vector coefficients because vector coefficient $i_7$ of the first group of vector component represents the $9^{th}$ most energetic vector coefficient, and since the second group $g_2$ does not comprise the $9^{th}$ to $16^{th}$ most energetic vector coefficients because vector coefficient $i_{71}$ of the second group of vector coefficients represents the $8^{th}$ most energetic vector coefficients.

Thus, in step 620 those vector coefficients may be identified which do not comply with the applied rule, i.e., and these vector coefficients are swapped until the rule is fulfilled.

Accordingly, in this example, vector coefficient $i_7$ of the first group of vector component is swapped for vector coefficient $i_{71}$ of the second group of vector coefficients in order to rearrange the first and second group of vector coefficients, wherein the rearranged groups of vector coefficients may be expressed as follows:

$$i' = \left(\underbrace{i_0 \ i_1 \ i_2 \ i_3 \ i_4 \ i_5 \ i_6 \ i_{11}}_{g_1} \ \underbrace{i_8 \ i_9 \ i_{10} \ i_7 \ i_{12} \ i_{13} \ i_{14} \ i_{15}}_{g_2}\right)$$

Thus, the order of the energy values of the rearranged vector i' (or of the rearranged groups of vector coefficients) is:
1 4 5 6 2 8 3 7 11 12 10 9 13 14 15 16, Then, at step 620 it is detected that the first group $g_1$ does comprise the 1th to $8^{th}$ most energetic vector coefficients and that the second group $g_2$ does comprise the $9^{th}$ to $16^{th}$ most energetic vector coefficients and thus the rule is fulfilled for each group of the two vector groups.

Then the method 600 may then proceed at reference sign 640 and may jump to step 530 of method 500.

Figure 7:
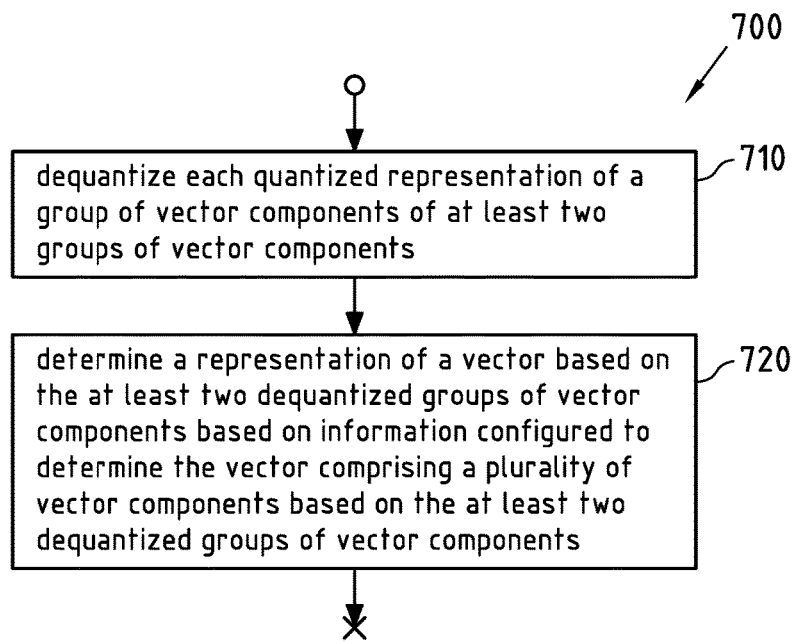
FIG. 7: a flowchart of a first example embodiment of a method according to a fourth aspect of the invention.

FIG. 7 shows a flowchart 700 of a first example embodiment of a method according to a fourth aspect of the invention.

The steps of this flowchart 700 may for instance be defined by respective program code 32 of a computer program 31 that is stored on a tangible storage medium 30, as shown in FIG. 1*b*. Tangible storage medium 30 may for instance embody program memory 11 of FIG. 1*a*, and the computer program 31 may then be executed by processor 10 of FIG. 1*a*.

For instance, this method 700 may be used for dequantizing the quantized representations of the groups of vector components obtained by any of the methods of the third aspect of the invention, e.g. obtained by step 530 of FIG. 5.

At a step 710 each quantized representation of a group of vector components of at least two groups of vector components is dequantized. These quantized at least two groups of vector components may represent at least two quantized groups of vector components obtained by any of the methods of the third aspect of the invention, e.g. by means of step 530 of FIG. 5.

Thus, said dequantizing of step 710 may be performed in a reverse order with respect of step 530 of FIG. 5, wherein each quantized group of vector components is dequantized in order to determine a respective dequantized group of vector components in step 710. As an example, this dequantizing may be performed in accordance with the third aspect of the invention.

At a step 720, a vector comprising a plurality of vector components is determined based on the at least two dequantized groups of vector components based on information configured to determine the vector comprising the plurality of vector components based on the at least two dequantized groups of vector components. This information configured to determine the vector comprising the plurality of vector components based on the at least two dequantized groups of vector components may represent the information configured to determine the input vector comprising the plurality of vector components based on the at least two dequantized groups of vector components described in the third aspect of the invention may for instance be received at a receiver together with at least two dequantized groups of vector components.

For instance, step 720 may comprise a re-swapping of vector components between different groups of the at least two dequantized groups of vector components. As an example, the information may comprise information on swapping performed between vector components of different groups of the at least two groups of vector components, e.g., this information may comprise information on each swap performed at step 630 defining of a vector component of a first group of the at least two groups of vector components for a vector component of a second group of the at least two groups of vector component. Thus, as an example, based on the information comprising information on swapping performed between vector components of different groups of the at least two groups of vector components, the swaps performed by method 600 may be undone with respect to the at least two dequantized groups of vector components until the at least two dequantized groups of vector coefficients correspond to the initial at least two groups of vector components of the third aspect of the invention before the swapping has been performed. Then, based on these at least two dequantized groups of vector coefficients the first representation of the input vector can be obtained, e.g., by merging the at least two dequantized groups of vector coefficients together in order to undo the splitting of the plurality of components of the input vector performed at the third aspect of the invention. For instance, if no swapping was necessary at method 600, then this may be indicated by the information and the at least two dequantized groups of vector coefficients may for instance be merged without any swap together for obtaining the input vector.

Or, as another example, if the initial mapping of vector components of the plurality of vector components of the input vector to the at least two groups of vector components in the third aspect has been performed in a way that the vector components are mapped to the at least two groups of vector components in accordance with the rule based on energy values associated with the vector components, the information configured to determine the vector comprising the plurality of vector components based on the at least two dequantized groups of vector components is indicative of this mapping and in step 720 the first quantized representation is obtained by performing a corresponding reverse mapping of vector coefficients of the at least two dequantized groups of vector coefficients to the plurality of vector components of the (input) vector.

For instance, any explanations presented with respect to the third aspect of the invention may also hold for the fourth aspect of the invention.

It has to be understood that the loops in these pseudo code examples are not limiting and may be arranged in a different way in order to extract the at least two codevector indexes from the single codevector index.

As used in this application, the term 'circuitry' refers to all of the following:

(a) hardware-only circuit implementations (such as implementations in only analog and/or digital circuitry) and (b) combinations of circuits and software (and/or firmware), such as (as applicable):

(i) to a combination of processor(s) or (ii) to portions of processor(s)/software (including digital signal processor(s)), software, and memory(ies) that work together to cause an apparatus, such as a mobile phone or a positioning device, to perform various functions) and (c) to circuits, such as a microprocessor(s) or a portion of a microprocessor(s), that require software or firmware for operation, even if the software or firmware is not physically present.

This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a positioning device.

With respect to the aspects of the invention and their embodiments described in this application, it is understood that a disclosure of any action or step shall be understood as a disclosure of a corresponding (functional) configuration of a corresponding apparatus (for instance a configuration of the computer program code and/or the processor and/or some other means of the corresponding apparatus), of a corresponding computer program code defined to cause such an action or step when executed and/or of a corresponding (functional) configuration of a system (or parts thereof).

The aspects of the invention and their embodiments presented in this application and also their single features shall also be understood to be disclosed in all possible combinations with each other. It should also be understood that the sequence of method steps in the flowcharts presented above is not mandatory, also alternative sequences may be possible.

The invention has been described above by non-limiting examples. In particular, it should be noted that there are alternative ways and variations which are obvious to a skilled person in the art and can be implemented without deviating from the scope and spirit of the appended claims.

The invention claimed is:

1. A method performed by an apparatus comprising a codec, said method comprising:

quantizing an input vector using a first quantization stage resulting in a residual vector, wherein the first quantization stage comprises a codebook having a plurality of codevectors, and wherein the quantized input vector is represented as a codevector index;

splitting a plurality of vector components of the residual vector into said at least two groups of vector components;

swapping a vector component of a first group of the at least two groups of vector components for a vector component of a second group of the at least two groups of vector components until each group of the at least two groups of vector components fulfils a rule; and quantizing at least one of the at least two groups of vector components with a second quantization stage comprising a plurality of lattice structures, wherein a lattice structure used for the quantization of the at least one of the at least two groups of vector components is selected from the plurality of lattice structures based on the codevector index from the first quantization stage.

2. The method according to claim 1, wherein said rule is one of:

a rule based on energy values associated with the vector components; and a rule based on a predefined norm associated with the vector components.

3. The method according to claim 2, wherein said rule specifies that the vector components of each of the at least two groups of vector components must fulfil a predefined energy characteristic.

4. The method according to claim 3, wherein said rule specifies that an energy value associated with a respective vector component of each vector component of the first group of the at least two groups of vector components is higher than an energy value associated with a respective vector component of each vector component of each group of the remaining groups of the at least two groups of vector components.

5. The method according to claim 1, wherein the at least two groups of vector components represent n groups of vector components $g_x$ with $x \in \{1, 2, \ldots n\}$ with $n \geq 2$, wherein an xth group $g_x$ of the at least two groups of vector components comprises $l_x$ vector coefficients of a plurality of vector coefficients of a first quantized representation of the input vector, and wherein said rule specifies that the $l_x$ vector coefficients of the xth group $g_x$ represent the $$\left(\left(\sum_{y=1}^{x-1} l_y\right)+1\right) th \text{ to } \left(\left(\sum_{y=1}^{x-1} l_y\right)+l_x\right)$$

most energetic (or less energetic) vector coefficients of the plurality of vector coefficients.

6. The method according to claim 1, further comprising determining information being configured to determine the input vector comprising the plurality of vector components based on the at least two groups of vector components.

7. An apparatus comprising a codec, the apparatus further comprising at least one processor; and at least one memory including computer program code, said at least one memory and said computer program code configured to, with said at least one processor, cause said apparatus at least to:

quantize an input vector using a first quantization stage resulting in a residual vector, wherein the first quantization stage comprises a codebook having a plurality of codevectors, and wherein the quantized input vector is represented as a codevector index;

split a plurality of vector components of the residual vector into said at least two groups of vector components;

swap a vector component of a first group of the at least two groups of vector components for a vector component of a second group of the at least two groups of vector components until each group of the at least two groups of vector components fulfils a rule; and quantize at least one of the at least two groups of vector components with a second quantization stage comprising a plurality of lattice structures, wherein a lattice structure used for the quantization of the at least one of the at least two groups of vector components is selected from the plurality of lattice structures based on the codevector index from the first quantization stage.

8. The apparatus according to claim 7, wherein said rule is one of:
 a rule based on energy values associated with the vector components; and
 a rule based on a predefined norm associated with the vector components.

9. The apparatus according to claim 8, wherein said rule specifies that the vector components of each of the at least two groups of vector components must fulfil a predefined energy characteristic.

10. The apparatus according to claim 9, wherein said rule specifies that an energy value associated with a respective vector component of each vector component of the first group of the at least two groups of vector components is higher than an energy value associated with a respective vector component of each vector component of each group of the remaining groups of the at least two groups of vector components.

11. The apparatus according to claim 7, wherein the at least two groups of vector components represent n groups of vector components $g_x$ with $x \in \{1, 2, \ldots n\}$ with $n \geq 2$, wherein an xth group $g_x$ of the at least two groups of vector components comprises $l_x$ vector coefficients of a plurality of vector coefficients of a first quantized representation of the input vector, and wherein said rule specifies that the $l_x$ vector coefficients of the xth group $g_x$ represent the $$\left(\left(\sum_{y=1}^{x-1} l_y\right) + 1\right) th \text{ to } \left(\left(\sum_{y=1}^{x-1} l_y\right) + l_x\right)$$

most energetic (or less energetic) vector coefficients of the plurality of vector coefficients.

12. The apparatus according to claim 7, wherein said at least one memory and said computer program code are further configured to, with said at least one processor, further cause said apparatus to determine information being configured to determine the input vector comprising the plurality of vector components based on the at least two groups of vector components.

* * * * *

UNITED STATES PATENT AND TRADEMARK OFFICE
CERTIFICATE OF CORRECTION

PATENT NO. : 10,665,247 B2
APPLICATION NO. : 15/424698
DATED : May 26, 2020
INVENTOR(S) : Adriana Vasilache, Anssi Sakari Ramo and Lasse Juhani Laaksonen Page 1 of 1

It is certified that error appears in the above-identified patent and that said Letters Patent is hereby corrected as shown below:

In the Claims

At Claim 1, Column 42, Line 5, "said at least two groups" should read --at least two groups--

At Claim 7, Column 43, Line 2, "said at least two groups" should read --at least two groups--

Signed and Sealed this
Sixth Day of April, 2021

Drew Hirshfeld
*Performing the Functions and Duties of the
Under Secretary of Commerce for Intellectual Property and
Director of the United States Patent and Trademark Office*